United States Patent [19]

Kausch et al.

[11] Patent Number: 5,322,761
[45] Date of Patent: Jun. 21, 1994

[54] FLEXOGRAPHIC PRINTING PLATE HAVING A VANADIUM OXIDE ANTISTATIC COATING LAYER

[75] Inventors: William L. Kausch, Cottage Grove; John A. Martens, Dellwood; Eric D. Morrison, West St. Paul, all of Minn.

[73] Assignee: Minnesota Mining and Manufacturing Company, St. Paul, Minn.

[21] Appl. No.: 893,498

[22] Filed: Jun. 4, 1992

[51] Int. Cl.$^5$ .................. G03C 1/492; G03C 1/494; G03C 1/76
[52] U.S. Cl. .................................. 430/273; 430/300; 430/306; 430/271; 430/281; 430/275
[58] Field of Search ............... 430/273, 271, 306, 281, 430/275, 300

[56] References Cited

U.S. PATENT DOCUMENTS

| | | | |
|---|---|---|---|
| 4,203,769 | 5/1980 | Guestaux | 430/631 |
| 4,865,948 | 9/1989 | Masumoto et al. | 430/270 |
| 5,006,451 | 4/1991 | Anderson et al. | 430/527 |
| 5,015,556 | 5/1992 | Martens | 430/306 |
| 5,187,044 | 2/1993 | Prioleau et al. | 430/271 |
| 5,215,859 | 6/1993 | Martens | 430/253 |

OTHER PUBLICATIONS

"Electric Moments of the Simple Alkyl Orthovanadates," Cartan et al., *J. Phys. Chem.*, 64, (1960), pp. 1756–1768.
"Mixed-Valence Polyvanadic Acid Gels," Gharbi et al., *Inorg. Chem.*, 21, (1982), pp. 2758–2765.
"Synthesis of Amorphous Vanadium Oxide from Metal Alkoxide," Hioki et al., *Nippon Seramikkusu Kyokai Gakujutsu Ronbunshi*, 97, (6), (1989), pp. 628–633 (English abstract provided).
"Synthesis of V$_2$O$_5$ Gels from Vanadyl Alkoxides,"
Hirashima et al., *Nippon Seramikkusu Kyokai Gakujutsu Ronbunshi*, 97, (1989), (3), pp. 235–238.
"Vanadium Pentoxide Gels,", Livage, *Chem. Mater.*, 3, (1991), pp. 578–593.
"Sol–Gel Synthesis of Vanadium Oxide from Alkoxides," Nabavi et al., *Eur. J. Solid State Inorg. Chem.*, 28, (1991), pp. 1173–1192.
Abstract for "Colloidal Vanadium Pentoxide," Ostermann, *Wiss. U. Ind.*, I, (1922), pp. 17–19.
Abstract for "Vanadic Acid Esters and Some Other Organic Vanadium Compounds," Prandtl et al., *Z. Anorg. Chem.*, 82, pp. 103–129.
"Synthesis and Characterization of Vanadium Oxide Gels from Alkoxy–Vanadate Precursors," Sanchez et al., *Mat. Res. Soc., Symp. Proc.*, 121, pp. 93–104.
"The Preparation of Colloidal Vanadic Acid," Wegelin, *Z. Chem. Ind. Kolloide*, 2, (1912), pp. 25–28; and English abstract therefor.
"Preparation of Colloidal Vanadic Acid by a New Dispersion Method," Muller, *Z. Chem. Ind. Kolloide*, 8, (1911), pp. 302–303; and English abstract therefor.
J. Livage, "Vanadium Pentoxide Gels", *Chem. Mater.* 1991, 3, 578–593.

*Primary Examiner*—Charles L. Bowers, Jr.
*Assistant Examiner*—Geraldine Letscher
*Attorney, Agent, or Firm*—Gary L. Griswold; Walter N. Kirn; Mark A. Litman

[57] ABSTRACT

A flexographic printing plate comprising in the following order: a flexible substrate, a photohardenable composition, and a colloidal vanadium oxide antistatic layer. The antistatic layer provides protection from static induced defects until and after the flexographic plate is processed.

22 Claims, No Drawings

FLEXOGRAPHIC PRINTING PLATE HAVING A VANADIUM OXIDE ANTISTATIC COATING LAYER

FIELD OF THE INVENTION

The present invention concerns an antistatic coating useful as an antistatic protection layer on flexographic printing plates. The preferred antistatic coating is formed from a coating composition of a vanadium oxide aqueous colloidal dispersion. The preferred printing plate is a dry developable flexographic printing plate.

BACKGROUND OF THE INVENTION

There is a growing interest in antistatic materials and coatings in various fields of technology, particularly in the photographic and electronics industries. Antistatic materials, i.e., antistats, are electrically conductive materials which are capable of transporting charges away from areas where they are not desired. This conduction process results in the dissipation of electrical charges, i.e., "static electricity." It is desirable to use antistats in applications where it is necessary to avoid the build-up of electrical charges, especially where the static buildup can discharge suddenly and produce a detrimental effect. For example, in imaging systems such as photographic applications, an antistatic coating on the imaging media can help to avoid sudden discharges of built-up electrical charge. A sudden discharge or spark can cause undesirable recordation of the associated flash of light.

A typical antistat comprises an organic or inorganic conductive material in a binder. Of these, preferable antistats are those that conduct electrons by a quantum mechanical mechanism rather than by an ionic mechanism. This is because antistats that conduct electrons by a quantum mechanical mechanism are effective independent of humidity. They are suitable for use under conditions of low relative humidity, without losing effectiveness, and under conditions of high relative humidity, without becoming sticky. A major problem, however, with such electron-conducting antistats is that they generally cannot be provided as thin, transparent, relatively colorless coatings by solution coating methods. Although there have been many attempts to do so, such as by using defect semiconductor oxide particle dispersions and conductive polymers, there has been very little success in overcoming this problem. The use of vanadium oxide has proven to be the one exception. That is, effective antistatic coatings of vanadium oxide can be deposited in transparent, substantially colorless thin films by coating from aqueous dispersions.

Vanadium oxide has three unique properties, i.e., its conduction mechanism, dispersibility, and morphology, which distinguish it from other antistatic coating materials. The latter two properties are generally highly dependent upon the method of synthesis, the first somewhat less so. The conduction mechanism in vanadium oxide is primarily a quantum mechanical mechanism known as small polaron hopping. By this mechanism, electrons are transported through the material by transference (i.e., by "hopping") from one vanadium ion to the next. This conduction mechanism does not require the presence of a well-developed crystalline lattice or a specific defect structure, as do defect semiconductors such as doped tin oxide or doped indium oxide.

Because small polaron hopping electronic conduction does not require a well-developed crystalline structure there is no need for an annealing step when a film or coating is made from vanadium oxide. Furthermore, vanadium oxide is conductive simply upon precipitation or formation in solution, without being adversely affected by changes in relative humidity. Thus, a highly dispersed form of vanadium oxide that exhibits electronic conductivity, and desirable morphology, particle size, and dispersion properties is useful for the preparation of conductive antistatic coatings.

The effectiveness of a dispersed form of vanadium oxide, i.e., a vanadium oxide colloidal dispersion, for the preparation of antistatic coatings can be expressed in terms of the surface concentration of vanadium. The surface concentration is described as the mass of vanadium per unit surface area, i.e., mg of vanadium per $m^2$ of substrate surface area, required to provide useful electrostatic charge decay rates. Generally, the lower the surface concentration of vanadium needed for effective conductivity in an antistatic coating, the more desirable the vanadium oxide colloidal dispersion. This is because with a lower surface concentration of vanadium, there is typically less color imparted to the coating, the coating is more transparent and uniform, and in some circumstances the coating generally adheres better to the substrate and may even provide better adhesion for subsequent layers.

In the mid-1970's, Claude Guestaux of Eastman Kodak reported that a previously known synthetic method provides a vanadium oxide colloidal dispersion which, at the time, was considered uniquely useful for the preparation of antistatic coatings. Guestaux's method was based on a process originally described by Maller in 1911. The method is described in U.S. Pat. No. 4,203,769 and consists of pouring molten vanadium pentoxide into water. The process produces a good antistatic coating, but has several drawbacks. These drawbacks include high energy requirements, the need for special reactor materials and equipment, and the creation of conditions which generate toxic vanadium oxide fumes. Furthermore, the Guestaux method results in incomplete dispersion of vanadium oxide. The non-dispersed vanadium oxide must then be removed from the viscous dispersion. However, such viscous vanadium oxide dispersions are usually very difficult to filter.

There are several other methods known for the preparation of vanadium oxide colloidal dispersions. These include inorganic methods such as ion exchange acidification of $NaVO_3$, thermohydrolysis of $VOCl_3$, and reaction of $V_2O_5$ with $H_2O_2$. However, vanadium oxide colloidal dispersions prepared by these methods using inorganic precursors are much less effective for the preparation of antistatic coatings than colloidal dispersions prepared by the process described by Guestaux in U.S. Pat. No. 4,203,769. To provide coatings with effective antistatic properties from dispersions prepared from inorganic precursors typically requires substantial surface concentrations of vanadium. Higher surface concentrations of vanadium generally result in the loss of desirable properties such as transparency, adhesion, and uniformity.

Flexography is a term that broadly applies to a printing format using a flexible substrate bearing an elastomeric or rubbery relief printing surface.

The first flexographic printing plates were produced from natural or synthetic rubber compositions which were cured chemically under heat and pressure in a mold utilizing conventional rubber curatives such as mercapto compounds (*Flexography: Principles and Practices,* 3rd Edition, Flexographic Technical Association, p. 158-162). More recently, photopolymer elastomeric compositions (elastomer containing compositions curable upon exposure to actinic radiation) useful to produce relief printing plates have been described. For example, U.S. Pat. Nos. 4,369,246 and 4,423,135 describe solvent-insoluble, elastomeric printing relief plates which are formed by applying to a sheet support a layer of a photosensitive composition comprising (1) at least 30 weight % of a solvent-soluble co-polymer containing at least 2 thermoplastic, non-elastomeric blocks of glass transition temperature above 25° C. and average molecular weight 2000-100000 and between these blocks, an elastomeric block copolymer having a glass transition temperature below 10° C. and average molecular weight 25,000-1,000,000; (2) at least 1 weight % of an addition polymerizable compound containing at least one terminal ethylenic group; and (3) a polymerization initiator at a dry thickness of 0.005-0.250 inch. A flexible polymer film and flexible cover sheet are laminated to the composition layer. The plate is formed by stripping off the cover sheet, imagewise exposing the layer to actinic radiation through the film, and removing the film and unexposed areas of the layer by solvent washing. Solvents such as perchloroethylene (1,1,1 trichloroethylene) either alone or in combination with alcohols such as n-butanol are utlized. Likewise, EP Pat. 261,910 describes a further example of a water-developable flexographic relief printing plate comprised of (1) monomers and polymers of acrylic acid esters and (2) a ketone photopolymerizing/photocrosslinking agent, which are coated on a support sheet. Following imagewise exposure (to promote crosslinking), the relief areas of the plate are produced by washout with an aqueous developer. After washout, all of the flexographic platemaking compositions and methods described heretofore require drying of the plate for extended periods (I to 24 hours) to remove entrained developer solution and then are subjected to a post-finishing process (chemical or photochemical) to reduce surface tack of the plate before use on a printing press. In addition to the extended time periods required to produce flexographic printing plates by the aforementioned technologies (by reason of the multiplicity of processing steps required in series), these technologies also produce potentially toxic by-product wastes in the development procedure. In the case of the solvent-washout technology, organic solvent waste is generated which is potentially toxic in the form of both the solvent and the addition polymerizable compound 2) which contains at least one terminal ethylenic group. Likewise,, the aqueous washout plate technologies also produce a contaminated waste water by-product stream which may contain similar addition polymerizable compounds that may have cytotoxic effects.

Many different types of monomers and cross-linkable resins are known in the polymer art, their properties can be adjusted as taught in the art to provide rigidity, flexibility, or other properties. Particularly good materials related to the compositions of the present invention are shown in U.S. Pat. Nos. 4,578,504; 4,638,040; and 4,786,657.

Various types of curable polyurethane elastomeric compositions are known. The term "elastomer" or "elastomeric" is used to refer to rubbers or polymers that have resiliency properties similar to those of rubber. In particular, the term elastomer reflects the property of the material that it can undergo a substantial elongation and then return to its original dimensions upon release of the stress elongating the elastomer. In all cases an elastomer must be able to undergo at least 10% elongation (at a thickness of 0.5 mm) and return to its original dimensions after being held at that elongation for 2 seconds and after being allowed 1 minute relaxation time. More typically an elastomer can undergo 25% elongation without exceeding its elastic limit. In some cases elastomers can undergo elongation to as much as 300% or more of its original dimensions without tearing or exceeding the elastic limit of the composition. Elastomers are typically defined to reflect this elasticity as in ASTM Designation D883-866 as a macro-molecular material that at room temperature returns rapidly to approximately its initial dimensions and shape after substantial deformation by a weak stress and release of the stress. ASTM Designation D412-87 can be an appropriate procedure for testing rubber properties in tension to evaluate elastomeric properties. Generally, such compositions include relatively high molecular weight compounds which, upon curing, form an integrated network or structure. The curing may be by a variety of means, including: through the use of chemical curing agents, catalysts, and/or irradiation. The final physical properties of the cured material are a function of a variety of factors, most notably: number and weight average polymer molecular weights; the melting or softening point of the reinforcing domains (hard segment) of the elastomer (which, for example, can be determined according to ASTM Designation D1238-86); the percent by weight of the elastomer composition which comprises the hard segment domains; the structure of the toughening or soft segment (low Tg) portion of the elastomer composition; the cross-link density (average molecular weight between crosslinks); and the nature and levels of additives or adjuvants, etc. The term "cured", as used herein, means cross-linked or chemically transformed to a thermoset (non-melting) or relatively insoluble condition.

U.S. Pat. No. 4,939,008 describes an aziridine functional layer which is used to bond a polyolefin layer to a polymeric substrate. The aziridine functional material is the same as the materials of the present invention used as a primer.

U.S. Pat. No. 5,015,446 describes a novel process for developing and imaging a flexographic printing plate in which backside ionizing radiation is used to establish a floor in the printing plate. The plate may then be dry developed by absorbing non-imagewise-irradiated composition from the printing plate. This type of plate offers many benefits to the user and the environment, but like many imaging materials suffers from static problems, especially in transport equipment. The static not only affects imaging, but may also impede the physical transport of materials through the developing apparatus.

U.S. patent application Ser. No. 07/699,666, filed on May 14, 1991 in the name of Prioleau and Canty discloses a preferred aziridine priming system for use with flexographic printing plates, especially those of the type described in U.S. Pat. No. 5,015,446.

SUMMARY OF THE INVENTION

The present invention has found that the use of antistatic coatings of vanadium oxides is particularly beneficial and desirable in flexographic printing plates. With this type of antistatic coating, the flexographic printing plate remains static resistant during both imaging and processing. This helps to prevent dust induced defects in the imaged plates. Vanadium oxide layers produced by hydrolysis of vanadium oxoalkoxides gives preferred antistatic layer products that are not gels, discrete particles, or products similar to those obtained from other inorganic precursors of which applicants are aware. Instead, hydrolysis of vanadium oxoalkoxides under appropriate conditions gives vanadium oxide colloidal dispersions that are exceptionally useful precursors for antistatic coatings. Highly effective vanadium oxide colloidal dispersions prepared by these methods are characterized by: high aspect ratio colloidal particles, as observed in the final coating state by field emission scanning electron microscopy; and well-dispersed particles, i.e., not unacceptably agglomerated or flocculated particles. They may also be characterized by an effective concentration of vanadium(IV) ions, which are believed to be a source of mobile electrons in the quantum mechanical small polaron hopping mechanism.

The alkoxide-derived vanadium oxide colloidal dispersions preferred in the practice of the present invention are similar to those prepared by the process of U.S. Pat. No. 4,203,769, except that $V^{4+}$ concentrations are much higher (in fact $V^{4+}$ concentrations can, predictably and reproducibly, be made to vary over a surprisingly wide range, i.e., over a range of about 1-40% of total vanadium content) in the colloidal dispersions of the present invention. Both dispersions are useful in the formation of the antistatic coatings of the present invention. The alkoxide process for the preparation of vanadium oxide colloidal dispersions offers advantages over the process of U.S. Pat. No. 4,203,769. This includes variable $V^{4+}$ concentrations, energy savings, convenience, elimination of conditions whereby highly toxic vanadium-containing fumes may be generated, absence of any need to filter the resultant colloidal dispersions, and ability to prepare the colloidal dispersion in situ (e.g., in organic polymer solutions).

Vanadium oxide sols, i.e., colloidal dispersions, preferred in the practice of the present invention are prepared by hydrolyzing vanadium oxoalkoxides with an excess of deionized water. Herein, "vanadium oxoalkoxides" refer to vanadium complexes with an oxide (=O) ligand and at least one alkoxide (—OR) ligand per vanadium atom. It is to be understood, however, that complexes referred to herein as vanadium oxoalkoxides may also include ligands other than the oxide and alkoxide groups. Examples of other ligands that may be present in the vanadium oxoalkoxides used in the present invention include carboxylates, sulfides, selenides, β-diketonates, halides, and pseudohalides such as —SCN— and —CN—. Preferably, however, the vanadium oxoalkoxides are trialkoxides with one oxide and three alkoxide ligands. The vanadium oxoalkoxides useful in the methods of the present invention may be monomeric, dimeric, or polymeric.

In preferred embodiments, the vanadium oxoalkoxides are prepared in situ, i.e., without isolation and/or purification of the vanadium oxoalkoxide prior to use, by combining a vanadium oxide precursor species and an alcohol. The vanadium oxide precursor species is preferably a vanadium oxyhalide or vanadium oxyacetate. If the "vanadium oxoalkoxide" is prepared from a vanadium oxide precursor species, it may also include ligands other than the oxide and alkoxide groups. For example, if a vanadium dioxide acetate is the vanadium oxide precursor species, the "vanadium oxoalkoxide" will typically contain oxide, alkoxide, and acetate ligands. These and other aspects of this area of technology are disclosed in U.S. patent application Ser. No. 07/893,502 filed Jun. 4, 1992 titled VANADIUM PENTOXIDE COLLOIDAL DISPERSIONS AND ANTISTATIC COATINGS.

Preferably, the vanadium oxoalkoxide is a trialkoxide of the formula $VO(OR)_3$, wherein each R is substituted or unsubstituted and is independently selected from a group consisting of aliphatic, aryl, heterocyclic, and arylalkyl radicals. Herein, "substituted" R groups, i.e., substituted organic groups, mean that one or more hydrogen atoms are replaced by a functional group that is nonreactive to hydrolysis, and noninterfering with the formation of colloidal dispersions. Preferably, such functional groups include halide, hydroxide, thiol, and carbonyl groups, or mixtures thereof.

Each R is preferably independently selected from the group consisting of $C_{1-10}$ alkyl, $C_{1-10}$ alkenyl, $C_{1-10}$ alkynyl, $C_{1-18}$ aryl, and $C_{1-18}$ arylalkyl radicals. These radicals can also be substituted, or they can be unsubstituted, i.e., contain only hydrogen atoms. If substituted, they are preferably substituted with a functional group such as a halide, hydroxide, thiol, carbonyl, or mixtures thereof. More preferably, each R is independently selected from a group consisting of unsubstituted $C_{1-6}$ alkyl radicals. When it is said that each R is "independently" selected from a group, it is meant that not all R groups in the formula $VO(OR)_3$ are required to be the same.

In the context of the present invention, the term "aliphatic" means a saturated or unsaturated linear, branched, or cyclic hydrocarbon radical. This term is used to encompass alkyls, alkenyls such as vinyl radicals, and alkynyls, for example. The term "alkyl" means a saturated linear or branched hydrocarbon radical. The term "alkenyl" means a linear or branched hydrocarbon radical containing at least one carbon-carbon double bond. The term "alkynyl" means a linear or branched hydrocarbon radical containing at least one carbon-carbon triple bond. The term "heterocyclic" means a mono- or polynuclear cyclic radical containing carbons and one or more heteroatoms such as nitrogen, oxygen, or sulfur or a combination thereof in the ring or rings, such as furan, thymine, hydantoin, and thiophene. It is preferred that any nitrogen atoms in the heterocyclic group be no more than weakly basic. The term "aryl" means a mono- or polynuclear aromatic hydrocarbon radical. The term "arylalkyl" means a linear, branched, or cyclic alkyl hydrocarbon radical having a mono- or polynuclear aromatic hydrocarbon or heterocyclic substituent. The aliphatic, aryl, heterocyclic, and arylalkyl radicals can be unsubstituted, or they can be substituted with various substituents such as Br, Cl, F, I, OH groups, and the like.

Herein, "vanadium oxide" colloidal dispersions refer to colloidal dispersions of mixed valence vanadium oxide, wherein the formal oxidation states of the vanadium ions are typically +4 and +5. In this field, such species are often referred to as $V_2O_5$.

Herein, the terms "sol," "colloidal dispersion," and "colloidal solution" are used interchangeably. They all refer to a uniform suspension of finely divided particles in a continuous liquid medium. The average particle size in a sol or colloidal dispersion is usually between about $5.0 \times 10^4$ μm and about $5.0 \times 10^{-1}$ μm.

The vanadium oxide colloidal dispersions of the present invention contain at least a minimum effective amount of vanadium and no greater than about 3.5 wt-% vanadium. Preferably they contain about 0.3 wt-% vanadium to about 2.0 wt-% vanadium. Herein, these weight percentages are calculated from the amount of vanadium in the vanadium oxoalkoxide starting material, and are based on the total weight of the dispersion. In preferred embodiments, the ratio of $V^{4+}$ ions to the total concentration of vanadium ions, i.e., $V^{4+} + V^{5+}$ ions, is at least about 0.01:1.0, preferably at least about 0.05:1.0, and more preferably at least about 0.30:1.0.

The hydrolysis process preferred in the practice of the present invention results in condensation of the vanadium oxoalkoxides to vanadium oxide colloidal dispersions. The hydrolysis can be carried out within a temperature range in which the solvent (i.e., deionized water or a mixture of deionized water and a water-miscible organic solvent) is in liquid form, e.g., within a range of about 0°–100° C. The process is preferably and advantageously carried out within a temperature range of about 20°–30° C., i.e., at about room temperature.

In preferred embodiments, the vanadium oxoalkoxide can be at least partially hydrolyzed before it is combined with the excess deionized water. This can be done, for example, by spray drying the oxoalkoxide in the presence of water. Although the subsequent hydrolysis can be accomplished by adding the excess deionized water to the vanadium oxoalkoxide, the vanadium oxoalkoxide is preferably added to the excess deionized water.

In preferred embodiments, the deionized water is combined with a water-miscible organic solvent, such as a low molecular weight ketone or an alcohol. In other preferred embodiments, the deionized water or mixture of deionized water and water-miscible organic solvent contains an effective amount of a hydroperoxide, such as $H_2O_2$. The reaction mixture can also be optionally modified by the addition of other reagents such as an organic polymer or prepolymer, the addition of metal dopants, by subsequent aging or heat treatments, or by the removal of alcohol by-products. By such modifications the vanadium oxide colloidal dispersion properties can be varied.

These methods provide a dispersed form of vanadium oxide which is extremely effective for the preparation of antistatic coatings. Such antistatic coatings impart properties to coated articles such as: reduced tendency to attract dust; reduced tendency to form static tracks; reduced formation of airborne dust during wood sanding operations; reduced tendency for sparking or damaging electronic components; and fewer film handling difficulties, etc. In sum, the alkoxide hydrolysis methods of the copending application [Ser. No. 07/893,279] produce vanadium oxide colloidal dispersions capable of forming effective and advantageous antistatic coatings with significantly less material than do known alkoxide hydrolysis methods.

The use of these preferred coatings, as well as the other vanadium oxide coatings of the prior art on flexographic printing plates has proven to be extremely effective in reducing static problems without interfering with the sensitometry or developability of the printing plate.

DETAILED DESCRIPTION

The present invention relates to a flexographic printing plate comprising a, radiation hardenable composition (radiation polymerizable, radiation curable, or radiation cross-linkable) as a layer on a flexible substrate, the substrate also containing an antistatic layer of vanadium oxide above the radiation curable layer. Other antistatic layers may be used in combination with the vanadium oxide antistatic layer. The plate is imagewise irradiated to harden the radiation curable (hardenable) composition in irradiated areas. Said imagewise irradiated layer may then be wash developed or preferably contacted with an absorbent layer which can absorb (or wick) unradiated composition when the composition has been heated between 40° and 200° C. The composition layer is heated so that it is at a temperature between 40° and 200° C. while in contact with said absorbent layer, the temperature being sufficiently high to enable said composition in unirradiated areas to flow into said absorbent layer. At least 75% of said composition in unirradiated areas in contact with said absorbent layer is absorbed by said absorbent layer, and by removing said absorbent layer, said at least 75% of composition from unirradiated areas is removed from said flexible substrate. The at least 75% removal is accomplished in at least one and up to ten steps of contact and heating with an absorbent material. The process can also utilize a predevelopment step that can improve the anchoring of the irradiated composition to the flexible substrate by first developing a 'floor' on the substrate. The imageable composition on a substrate which transmits ionizing radiation (e.g., e-beams, short wavelength U.V. radiation, etc.) is first generally exposed through the substrate to generate a floor of polymerized composition. This floor is not removed from the substrate during develoopment and is not to be considered in the determination of the at least 75% of composition removed from non-irradiated areas. It is desirable that the elevated temperatures used to cause the unirradiated composition to flow (reduce its viscosity, or exceed its softening temperature, e.g., see ASTM Designation D 1238-86) into and be absorbed by the absorbent layer (without the necessity of reduced air pressure behind the layer) should not distort the flexible substrate or the hardened composition by more than 2% in any surface dimension. The actual temperatures will vary with the specific substrate and composition used. Preferably at least 80% of the unirradiated composition is removed from the areas heated in contact with the absorbent layer. More preferably at least 90 or at least 95% is removed. The hardening or curing step of the process (by irradiation) can also act to increase the adhesion of the composition to the substrate. This can be by direct adhesion of the curing composition to the substrate (either chemical adhesion by reaction or physical adherence to surface structure on the flexible layer) or by adhesion (usually by chemical reaction) to a primer layer on the substrate. The primer preferred layer in the practice of the present invention is an azirdine functional composition.

The structure of the printing plate of the present invention may comprise at least a flexible substrate, an optional but highly preferred primer layer, the radiation curable or photohardenable composition layer of the flexographic printing plate, an optional but highly preferred radiation hardenable or curable pigmented topcoat layer (being a "top-coat" to the radiation curable or photohardenable or elastomeric composition layer), and the vanadium oxide antistatic layer. The nature of the radiation hardenable topcoat layer should, of course be adjusted to be compatible with the development procedures intended for the printing plate. If the plate is to be wash-off developed, the topcoat composition must be solvent dispersible or soluble in the development solvent when the topcoat composition is in an uncured state. If the plate is to be dry developed by wicking or absorption of the uncured polymer composition, the uncured topcoat composition must be flowable at the development temperatures used with the dry processing.

The nature of the Vanadium oxide antistatic layer is such that it does not interfere with the wash-off or dry development of the photosensitive layer. The Vanadium oxide layer becomes bound to (actually it appears to become embedded in) the cured photosensitive layer and/or becomes bound to or embedded in the cured radiation sensitive, pigmented top-coat layer during manufacture. The sensitivity of the top-coat layer should also be similar to that of the actual printing plate layer if multiple exposures are to be avoided. Of course, if a broad band of wavelengths is used as the exposing radiation for imaging, the sensitivity of the top-coat would not have to be close to the sensitivity of the printing plate layer, but would merely have to be within the broad band of wavelengths used in the exposure step.

The preferred uncured and/or cured elastomer compositions have a further property of a reduced tendancy to swell or increase in volume when immersed in flexographic inks, such as water based inks utilized in the flexographic printing process. This low swell property is critical to the ultimate printing quality which can be achieved with the printing plate since swelling causes the relief image to enlarge. A 2% dot for instance, due to inordinate swelling of the plate in the printing ink may actually print as a 15 or 20% dot on the printed page due to this undesirable phenomenon. The press life or wear life of the plate on press (the number of impressions until failure occurs) may also be greatly reduced by swelling which may result in a loss in physical strength of the cured elastomer compositon.

Further features of the radiation curable polyurethane elastomers of this invention are their relatively low melting temperatures and high melt indices (low melt viscosities). The present invention particularly concerns flexographic printing plates produced from novel radiation curable polyurethane elastomeric compositions, which printing plates are developed utilizing a novel solventless absorption processing method. The absorption flexographic plate processing method eliminates the need for liquid developers (water or solvent) of any kind. This novel plate making method results in a substantial reduction of plate making steps, plate making process time, and the elimination of potentially toxic by-product waste streams in plate making. While it is foreseen that the radiation curable elastomeric polyurethane compositions according to the present invention may be used for other purposes, and in other industries,, they are particularly well suited for application to the flexographic printing industry.

The storage stability of the radiation curable elastomer coated sheet material prior to curing is also important. Specifically, resistance of the elastomer layer to cold flow during storage is desirable. If the elastomer layer undergoes too much cold flow, the resulting printing plate may lose its utility due to changes in plate thickness uniformity which could occur during such flow. The radiation curable polyurethane elastomers of this invention are noted by a resistance and even a high resistance to cold flow prior to irradiation induced crosslinking or curing.

Generally, a flexographic printing plate consists of a curable elastomeric polymer layer which is planar contiguous to a flexible support layer or sheet which may be, for example, polymeric (film base) or metallic (metal base). Following cure of portions of the elastomeric layer (by imagewise exposure to actinic radiation), the uncured portions are removed to reveal a relief structure (hills) which becomes the printing surface of the plate in the flexographic printing process;. The relief structure (in the cured areas) is bound to the support layer by physical and/or chemical action so as to remain in place during the printing process through repeat impressions. The exposed surface of the cured elastomer layer becomes the ink receptive surface which both receives ink from the inking roll (anilox) and transfers it to the substrate to be printed during the printing process. The flexographic printing process is a 'direct' printing process because the printing plate and its temporarily bound ink layer are in direct contact with the substrate (e.g., paper or film) being printed. A variety of substances may be used as the support layer beneath the cured elastomeric layer of a flexographic printing plate. Flexible substrates of synthetic polymeric resins such as polyester, polycarbonate, or polyimide films may be used or more rigid substrates (which are still flexible) such as steel or aluminum coil stocks may be selected.

The adherence properties of the radiation hardenable composition to the flexible substrate both prior to hardening, after hardening, and when heated for removable are important to the performance of the flexographic system. It is not sufficient that the composition adhere well to the plate after hardening. The composition must adhere reasonably well before hardening yet release easily when thermally softened. The preferred aziridine functional compositions provide these desirable properties.

One reaction known to yield vanadium oxide products is the hydrolysis of vanadium alkoxides. The products of this hydrolysis reaction typically include solutions of partially hydrolyzed vanadium alkoxide species, $V_2O_5$ gels, and $V_2O_5$ particulates. None of the products produced by this reaction, however, has been described as a vanadium oxide colloidal dispersion with properties similar to those of the dispersion prepared according to the process of U.S. Pat. No. 4,203,769 (Guestaux). The products produced by the known hydrolysis methods require more relatively thick coatings for effective conduction. That is, using vanadium oxide colloidal dispersions produced from the hydrolysis of vanadium alkoxides according to known methods, the amount of vanadium oxide required in a coating, i.e., the surface concentration of vanadium, for effective antistatic properties is relatively high. Thus, using vanadium oxide colloidal dispersions produced by known alkoxide hydrolysis methods, there are more, but in flexographic printing plate systems, but tolerable problems with color formation, transparency, adhesion, and uniformity in the antistatic coatings.

A report by C. Sanchez et al. in *Mat. Res. Soc., Symp. Proc.*, 121, 93 (1988) discusses the hydrolysis of vanadium oxoalkoxides by an excess of water. Therein, it is stated that the chemical pathway leading to $V_2O_5$ solutions and gels from this hydrolysis method is similar to the pathway leading to $V_2O_5$ solutions from inorganic precursors such as $NaVO_3$ and $VOCl_3$. Sanchez et al.

also state that the $V_2O_5$-$nH_2O$ gels so obtained have structural and physical properties close to that of vanadium pentoxide gels prepared by polymerization of decavanadic acid. Because sols and gels prepared from inorganic precursors, including decavanadic acid, generally do not form advantageous antistatic coatings, it has therefore been generally understood that vanadium oxide colloidal dispersions produced from the hydrolysis of vanadium oxoalkoxides do not form advantageous antistatic coatings.

Preferred vanadium oxide colloidal dispersions used in the present invention are prepared by hydrolyzing vanadium oxoalkoxides with an excess of deionized water. The vanadium oxoalkoxides can be any of a variety of compounds that can produce colloidal dispersions capable of forming, i.e., usable to produce, antistatic coatings with the properties desired as herein defined.

The preferred vanadium oxoalkoxides used in the the present invention are vanadium complexes with one oxide ligand (=O) and at least one alkoxide ligand (—OR) per vanadium atom. They may also include ligands other than the oxide and alkoxide groups, such as carboxylyates, sulfides, selenides, $\beta$-diketonates, halides, and pseudohalides such as —SCN— and —CN—. The vanadium oxoalkoxides useful in the methods of the present invention may be monomeric, dimeric, or polymeric.

Preferably, the vanadium oxoalkoxides are of the formula $VO(OR)_3$, i.e., vanadium oxotrialkoxides, wherein each substituent R is substituted or unsubstituted and is independently selected from the group consisting of aliphatic, aryl, heterocyclic, and arylalkyl radicals. Preferably each R is independently selected from the group consisting of $C_{1-10}$ alkyl, $C_{1-10}$ alkenyl, $C_{1-10}$ alkynyl, $C_{1-18}$ aryl, and $C_{1-18}$ arylalkyl radicals. Each of these preferred alkoxide R groups may be substituted or unsubstituted. They may be substituted with halides, hydroxides, thiols, carbonyls, or mixtures thereof. More preferably each R group is independently selected from the group consisting of unsubstituted $C_{1-6}$ alkyl radicals. Examples of usable vanadium oxotrialkoxides include, but are not limited to, $VO(OEt)_3$, $VO(O\text{-}i\text{-}Pr)_3$, $VO(O\text{-}n\text{-}Pr)_3$, $VO(O\text{-}i\text{-}Bu)_3$, $VO(O\text{-}n\text{-}Bu)_3$, $VO(O\text{-}t\text{-}Amyl)_3$, $VO(O\text{-}n\text{-}pentyl)_3$, and $VO(O\text{-}CH_2CMe_3)_{2.3}(O\text{-}i\text{-}Bu)_{0.7}$. It is understood that the hydrolysis process can involve hydrolyzing one or more vanadium oxoalkoxides, i.e., a mixture of oxoalkoxides.

The vanadium oxoalkoxides can also be prepared in situ prior to use from a vanadium oxide precursor species and an alcohol. That is, the vanadium oxoalkoxides can be prepared without isolation and/or purification from a vanadium oxide precursor species and an alcohol. For example, the vanadium oxoalkoxides can be generated by combining a vanadium oxide precursor species, such as, for example, a vanadium oxyhalide $(VOX_3)$, preferably $VOCl_3$, or vanadium oxyacetate $(VO_2OAc)$, with an appropriate alcohol, such as $i\text{-}BuOH$, $i\text{-}PrOH$, $n\text{-}PrOH$, $n\text{-}BuOH$, $t\text{-}BuOH$, and the like. It is understood that if vanadium oxoalkoxides are generated from a vanadium oxide precursor species and an alcohol, they may contain ligands other than oxide and alkoxide ligands. For example, the product of the reaction of vanadium oxyacetate with an alcohol is a mixed alkoxide/acetate. Thus, herein the term "vanadium oxoalkoxide" is used to refer to species that have one oxide (=O) ligand and at least one alkoxide (—OR) ligand per vanadium atom, particularly if prepared in situ, i.e., without isolation and/or purification of the vanadium oxoalkoxide. Preferably, however, the vanadium oxoalkoxides are trialkoxides with one oxide and three alkoxide ligands.

The in situ preparations of the vanadium oxoalkoxides are preferably carried out under a nonoxidizing atmosphere such as nitrogen or argon. The vanadium oxide precursor species is typically added to an appropriate alcohol at room temperature. Preferably, it is added at a controlled rate such that the reaction mixture does not greatly exceed room temperature, if the reaction is exothermic. The temperature of the reaction mixture can be further controlled by placing the reaction flask in a constant temperature bath, such as an ice water bath. The reaction of the vanadium oxide precursor species and the alcohol can be done in the presence of an oxirane, such as propylene oxide, ethylene oxide, or epichlorohydrin, and the like. The oxirane is effective at removing by-products of the reaction of the vanadium oxide species with alcohols. If desired, volatile starting materials and reaction products can be removed through distillation or evaporative techniques, such as rotary evaporation. The resultant vanadium oxoalkoxide product, whether in the form of a solution or a solid residue after the use of distillation or evaporative techniques, can be combined directly with water to produce the vanadium oxide colloidal dispersions preferably used in the present invention.

The coatings may be made by combining a vanadium oxoalkoxide and an excess of water, preferably with stirring until a homogeneous colloidal dispersion forms. By an "excess" of water, it is meant that a sufficient amount of water is present relative to the amount of vanadium oxoalkoxide such that there is greater than 1 equivalent of water per equivalent of vanadium oxoalkoxide. That is, there is greater than a 1:1 molar ratio of water to vanadium-bound alkoxide ligands. Preferably, a sufficient amount of water is used such that the final colloidal dispersion formed contains no greater than about 3.5 wt-% vanadium and at least a minimum effective amount of vanadium. This typically requires a molar ratio of water to vanadium alkoxide of at least about 45:1, and preferably at least about 150:1. Herein, by "minimum effective amount" of vanadium it is meant that the colloidal dispersion contains an amount of vanadium in the form of vanadium oxide, whether diluted or not, which is sufficient to form an effective antistatic coating for the use desired.

For most uses, an effective antistatic coating has a surface concentration of vanadium, i.e., coating weight, ($[V]_{off}$, calculated in mg of vanadium per $m^2$ of substrate surface area) of less than about 12 $mg/m^2$; however, for some end uses a value of $[V]_{off}$ of less than about 20 $mg/m^2$ can be tolerated. For preferred uses, however, it is desirable that the antistatic coating have a $[V]_{off}$ of less than about 6.0 $mg/m^2$, and more preferably less than about 3.0 $mg/m^2$, most preferably less than about 2.0 $mg/m^2$. Generally, the lower the surface concentration of vanadium required for effective conduction of electrostatic charges, the thinner the coating, which is advantageous and commercially desirable because thinner vanadium oxide coatings are generally less colored, more transparent, more uniform, and in certain circumstances possess better adhesion properties than do thicker coatings.

The value of $[V]_{off}$ is the calculated surface concentration of vanadium required to provide an electrostatic charge decay time of less than 0.10 seconds for decay of a 5000 V potential to less than 50 V. The surface concentration of vanadium in antistatic coatings can be calculated from: (1) formulation data, assuming 100% conversion of the vanadium oxalkoxide to the vanadium oxide colloidal dispersion, and also assuming the density of each successively diluted vanadium oxide colloidal dispersion is that of water (1.0 g/mL); and (2) the wet coating thickness (the wet coating thickness applied using a No. 3 Mayer Bar is 6.9 μm).

Colloidal dispersions with a vanadium concentration greater than about 3.5 wt-% are not generally desirable because they typically have poor dispersion properties, i.e., they are not dispersed well and are too gelatinous, and the coatings produced therefrom have poor antistatic properties. A coating with "poor" antistatic properties is one with a $[V]_{off}$ value of greater than about 20 mg/m$^2$. Interestingly, colloidal dispersions originally prepared containing above about 3.5 wt-% vanadium do not typically exhibit improved properties if diluted to a colloidal dispersion containing a lesser amount of vanadium prior to formation of the coating. That is, the properties of a vanadium oxide colloidal dispersion containing above about 3.5 wt-% vanadium can not be easily improved upon dilution of the colloidal dispersion. It is possible, however, to improve the quality and stability of the colloidal dispersions containing above about 3.5 wt-% vanadium by adding an amine, such as, for example, N,N-diethylethanolamine. Although not intending to be limiting, it is believed that this increases the degree of ionization of colloidal particles by deprotonating V-OH groups.

In preparing preferred embodiments of the vanadium oxide colloidal dispersions, a sufficient amount of water is used such that the colloidal dispersion formed contains about 0.3 wt-% to about 2.0 wt-% vanadium. Most preferably, a sufficient amount of water is used so that the colloidal dispersion formed upon addition of the vanadium-containing species contains about 0.6 wt-% to about 1.7 wt-% vanadium.

Preferably, the water used in these methods is deionized water. The use of deionized water avoids problems with flocculation of the colloidal particles in the dispersions. Because a sol or dispersion, by definition, is the suspension of very small, charged particles, an overall change in particle charge, which can result from ions in the water, can lead to flocculation. Thus, deionized water is preferred because the colloidal dispersions formed contain well dispersed particles, which is advantageous for the formation of effective antistatic coatings.

By "deionized" water, it is meant that the water has had a significant amount of any $Ca^{2+}$, $Mg^{2+}$, and $Fe^{2+}$ ions originally present removed. Preferably, the deionized water contains less than about 50 parts per million (ppm) of these multivalent cations (total concentration of all multivalent cations), and more preferably less than about 5 ppm. Most preferably, the deionized water of the present invention contains less than about 50 ppm of a total cation concentration, including multivalent cations and monovalent cations, such as $Na^+$.

Multivalent cations cause the greatest detrimental effect to the quality of the dispersions of the present invention. That is, the dispersions are much more tolerant of monovalent cations, such as $Na^+$, than they are of multivalent cations, such as $Ca^{2+}$, $Mg^{2+}$, and $Fe^{2+}$. For example, the dispersions of the present invention can tolerate a total concentration of multivalent cations of up to about 50 ppm (parts per million), and a total concentration of monovalent cations of up to about 500 ppm, before flocculation occurs and the quality of the dispersion is significantly diminished.

As long as the water is deionized, there is no requirement that it be distilled. Thus, deionized tap water or well water can be used. A variety of methods can be used to remove multivalent cations ($Ca^{2+}$, $Mg^{2+}$, and $Fe^{2+}$) and monovalent cations ($Na^+$) from water. These include the use of commercial deionizing columns, ion exchange resins, or reverse osmosis systems. In a typical ion exchange process, water is passed through a column containing ion exchange resin having $H^+$ ions and then through a column containing ion exchange resin having $OH^-$ ions. The cations in the water are replaced by the $H^+$ ions from the resin, and the anions in the water are replaced by the $OH^-$ ions in the resin to create "deionized" water. Depending on the charge balance of the water, it can be neutral, slightly acidic, or slightly basic. The "deionized" water of the present invention can also be prepared using "softening" agents, such as $Na_2CO_3$, which replace the multivalent cations with $Na^+$. Thus, the term deionized water, as used herein, includes within its scope "soft" water, which contains $Na^+$ ions; however, for soft water to be usable in the preparation of good quality dispersions, it is preferred that the water contain less than about 500 ppm $Na^+$ ions.

Deionized water useful in the methods of the present invention generally has a pH sufficient to render colloidal dispersions with a pH of about 1.5 to about 8.0. If the pH of the colloidal dispersion is less than about 1.5, the dispersion properties are usually detrimentally affected such that they produce inadequate antistatic coatings. If the pH of the colloidal dispersion is more than about 8.0, the dispersion properties are also detrimentally affected typically because of the dissolution of vanadium oxide to form vanadate compounds. Typically, deionized water with a pH within a range of about 5.0 to about 9.0 will produce a colloidal dispersion with a pH within a range of about 1.5 to about 8.0.

In a preferred preparation process for the antistatic coatings used in the present invention, a vanadium oxoalkoxide is preferably hydrolyzed by adding the vanadium oxoalkoxide to the water, as opposed to adding the water to the vanadium oxoalkoxide. This is advantageous because it typically results in the formation of a desirable colloidal dispersion and generally avoids excessive gelling. Whether the vanadium oxoalkoxide is added to the water or the water is added to the vanadium oxoalkoxide, the vanadium oxoalkoxide can be at least partially hydrolyzed before it is combined with the excess water. This can be done, for example, by spray drying the oxoalkoxide in the presence of water. The spray dried vanadium oxoalkoxide can then be combined with the excess deionized water.

In these processes, the water initially reacts with the vanadium oxoalkoxides in a hydrolysis reaction. The hydrolyzed product then subsequently undergoes a condensation reaction to form a mixed valence vanadium oxide colloidal dispersion. That is, the vanadium oxide colloidal dispersions formed contain vanadium atoms in both the $+4$ and $+5$ formal oxidation states. Often the product is referred to as vanadium pentoxide ($V_2O_5$); however, its molecular formula can be more accurately represented by $V_2O_{4.67}$.

As long as there is an excess of water used in the hydrolysis and subsequent condensation reactions of the vanadium oxoalkoxides, water-miscible organic solvents can also be present. That is, in certain preferred embodiments the vanadium oxoalkoxides can be added to a mixture of water and a water-miscible organic solvent. Miscible organic solvents include, but are not limited to, alcohols, low molecular weight ketones, dioxane, and solvents with a high dielectric constant, such as acetonitrile, dimethylformamide, dimethylsulfoxide, and the like. Preferably, the organic solvent is acetone or an alcohol, such as i-BuOH, i-PrOH, n-PrOH, n-BuOH, t-BuOH, and the like.

Preferably, the reaction mixture also contains an effective amount of hydroperoxide, such as, for example, $H_2O$ or t-butyl hydroperoxide. An "effective amount" of a hydroperoxide is an amount that positively or favorably affects the formation of a colloidal dispersion capable of producing an antistatic coating with a value of $[V]_{off}$ of less than about 2.0 mg/m$^2$. The presence of the hydroperoxide enhances the reaction by facilitating production of an antistatic coating with highly desirable properties. Furthermore, the presence of the hydroperoxide appears to improve the dispersive characteristics of the colloidal dispersion. That is, when an effective amount of hydroperoxide is used the resultant colloidal dispersions are less cloudy, less turbid, and more well dispersed. The hydroperoxide is preferably present in an amount such that the amount of vanadium in the vanadium oxoalkoxide added to the hydroperoxide is within a range of about 1-4 moles of vanadium per mole of hydroperoxide originally present. While not wishing to be held to any particular theory, it is believed that the hydroperoxide accelerates the formation of acicular, i.e., needle-like, vanadium oxide colloidal particles.

Advantageously, the process of the present invention can be carried out in the presence of an organic polymer or prepolymer. In this way, colloidal dispersions of vanadium oxide can be prepared in situ in solutions or dispersions of organic polymers or prepolymers with which colloidally dispersed vanadium oxide is otherwise incompatible, as evidenced by flocculation of the colloidal dispersion. The organic polymers or prepolymers that are usable in this in situ manner are those that are soluble or dispersible in water or water plus a water-miscible solvent. Such organic polymers or prepolymers include, but are not limited to, polyacrylic acid; polyols such as those available from Dow Chemical under the trademark VORANOL; polyvinyl alcohols; hydroxyethyl cellulose; polymethyl methacrylate; polyethyl acrylate; polystyrene; polystyrene/butadiene copolymers; polyvinylidene chloride; and the like. Preferably, the useful organic polymers or prepolymers are "soluble" in water or a mixture of water and a water-miscible organic solvent as described above. The ratio of the number of moles of vanadium oxoalkoxide initially added to the number of moles of an organic polymer or prepolymer can vary within a range of about 1:1 to about 1:200.

Generally, the hydrolysis and condensation reactions of the vanadium oxoalkoxides using an excess of water, can be carried out in air. Also, although it is preferred that the alkoxide be added to the water, the rate of addition is not typically crucial. It is desirable, however, that the mixture be stirred during the hydrolysis and condensation reactions. Furthermore, the initial hydrolysis can be carried out at any temperature in which the solvent (i.e., water or a mixture of water and a water-miscible organic solvent) is in a liquid form, e.g., within a range of about 0°-100° C. It is preferred, however, that the initial hydrolysis, and subsequent condensation, reactions be carried out within a temperature range of about 20°-30° C., i.e., at about room temperature.

The homogeneous solution resulting from hydrolysis is preferably subjected to an aging process to allow for initially formed vanadium oxide fibrils to coalesce. Although this is preferred and advantageous for certain applications, the colloidal dispersions of the present invention do not need to be aged to be useful or to provide advantage over the vanadium oxide colloidal dispersions produced by known alkoxide hydrolysis methods. The aging process typically involves storing the solution in a constant temperature bath until a thixotropic colloidal dispersion is formed. Preferably, the aging is conducted for about 1-6 days in a 20°-90° C. water bath, more preferably a 40°-60° C. water bath. Improvement can be observed, however, with aging conditions of up to about 10 days. Most preferably, aging is conducted for a short period of time, such as for about 8-24 hours. Typically, an aged colloidal dispersion provides a more advantageous coating than one that has not been aged. For example, a coating made from an unaged colloidal dispersion can require a surface vanadium concentration 8 times greater than a material aged at 90° C. for 8 hours (to provide an electrostatic charge decay time of less than 0.10 seconds for decay of a 5000 V potential to less than 50 V). Thus, the aging process results in a colloidal dispersion capable of forming thinner coatings, i.e., coatings with less color.

The concentration of $V^{4+}$ in the resultant colloidal dispersions can be determined by titration with permanganate. Preferably, the mole fraction of $V^{4+}$ to $(V^{4+} + V^{5+})$, i.e., $V^{4+}$/total vanadium, is at least about 0.01:1.0, preferably at least about 0.05:1.0, and more preferably at least about 0.30:1.0. The concentration of $V^{4+}$ in the resultant colloidal dispersions can be easily varied, however, simply by removing volatile reaction products through distillation subsequent to hydrolysis of the vanadium oxoalkoxide. Significantly, the $V^{4+}$ concentrations can be varied over a range of about 1-40% of the total vanadium content. Although not intending to be limited by any theory, it is believed that the concentration of $V^{4+}$ may contribute to the intrinsic conductivity of the coatings. Furthermore, it is believed that the $V^{4+}$ ions contribute to the formation of the colloidal dispersions, perhaps acting as polymerization initiators or by controlling intercalation.

The vanadium oxide colloidal dispersions of the present invention can be diluted as desired with water or a water-miscible organic solvent prior to coating onto a substrate. The water-miscible organic solvent can be any of those listed above that can be present in the reaction mixture during the preparation of the colloidal dispersions. Preferably, the organic solvent with which the colloidal dispersion is diluted, prior to forming a film, is acetone or an alcohol.

Typically, the colloidal dispersions can be stored at any concentration. Preferably, they are stored at a concentration of about 0.3 wt-% to 2.0 wt-% vanadium. If necessary, the originally formed dispersions can be diluted to this concentration with water or a water-miscible organic solvent. No particular precautions need be observed during storage other than maintaining the temperature above the freezing point of the colloidal dispersions. If allowed to freeze, the colloidal dispersion is generally destroyed. The colloidal dispersions can be stored in any type of container, preferably glass or plastic. Furthermore, they can be stored in the presence or absence of light. Typically, as long as the colloidal dispersions are kept in a sealed container (to avoid evaporation of water), they are stable for at least about 6 months.

The vanadium oxide colloidal dispersions can be coated onto any flexible substrate used as a strippable top film for the flexographic printing plates of the present invention. When this strippable top film is removed from the radiation curable layer (prior to imaging), the antistatic vanadium oxide layer is transferred to the radiation hardenable layer thereby imparting the antistatic properties to the element carrying the hardenable layer. The antistatic layers of the present invention may also be coated directly onto the radiation hardenable layers and no strippable layer or additional layers are needed, although as previously mentioned, the radiation curable, pigmented top-coat layer is preferred. Advantageously, however, the antistatic layers of the present invention are coated on nonconductive substrates, or substrates that have less than a desirable conductivity for the proposed use. That is, the vanadium oxide colloidal dispersions are preferably used on any flexible substrate or product for which the removal of electrostatic charges is desirable, otherwise the coating might be superfluous to that substrate, although the contributions to the printing plate to which it is transferred are critical. It is necessary that the temporary substrate to which the Vanadium oxide is applied and then carried to the printing plate for transfer thereto must have insufficient bond strength to the Vanadium oxide coating so as to allow the Vanadium oxide coating to be transferred to the hardenable composition upon removal of the temporary carrier. The temporary carrier may also bear the radiation curable, pigmented layer which can then be transferred to the the surface of the radiation curable printing plate composition. For example, the colloidal dispersions can be coated onto materials such as paper (particularly with a release coating thereon), cloth (also usually needing a release coating), flexible ceramic materials, and a variety of polymeric materials, including cellulose esters, polyesters, polycarbonates, polyolefins, copolymers, and terpolymers. Release coatings may be needed on some of these materials also. The colloidal dispersions of the present invention can be coated directly onto any of these substrates or over an intermediate layer of a material that promotes or reduces adhesion, as needed for the desired properties, between the antistatic coating and the substrate.

The vanadium oxide colloidal dispersions can be applied to a substrate by a variety of conventional solution coating methods. These include, but are not limited to, roll coating, brush coating, hopper coating, curtain coating, slide coating, knife coating, and rotogravure coating. Advantageously, the colloidal dispersions are coated using a slide coating, roll coating, or rotogravure coating process. These methods, and the techniques by which they are implemented, are all well known in the coating industry.

The amount of vanadium oxide colloidal dispersion used in the coating process can be widely varied. The upper limit of the amount used is generally controlled by the quality of the particular dispersion and the desire for a transparent and relatively colorless coating, i.e., one that is difficult to detect by the human eye. That is, although coatings can be prepared with coverages of 100 mg/m$^2$ and higher, for many uses it is preferable to have as thin a coating as possible, e.g., no more than about 3.0 mg/m$^2$, to decrease the color imparted to the coating, increase its transparency, improve uniformity, and in certain circumstances improve adhesion. Such thin coatings typically require a high quality colloidal dispersion, such as can be produced using the methods of the present invention, because the lower the quality of the colloidal dispersion, the more material needed to produce an acceptable antistatic coating. Because the vanadium oxide colloidal dispersions are colored, the more material used the more the coating is colored; however, if the colloidal dispersions are coated thinly enough on a substrate, they do not appear colored.

The coatings prepared from the vanadium oxide colloidal dispersions preferred in the present invention typically contain whisker-shaped or needle-shaped particles. These particles have a high aspect ratio, i.e., the ratio of the length to the width of the particles, and are generally evenly distributed. By "high aspect ratio" it is generally meant that the ratio of the length to the width of the particles, as observed in the coatings produced from the colloidal dispersions invention by Field Emission Electron Microscopy, is greater than about 25.

The vanadium oxide colloidal dispersions and antistatic coatings preferred in the present invention can contain a variety of additives as desired. They can contain polymeric binders that improve the mechanical properties of the antistatic coatings; wetting agents that promote coatability; metal dopants or modifiers such as $VO_2$, $Ag_2O$, $Cu_2O$, $Mno$, $ZnO$, $Nb_2O_5$, $MoO_3$, $WO_3$, $Sb_2O_3$, $GeO_2$, $Nd_2O_3$, $Sm_2O_3$, $Gd_2O_3$, $Yb_2O_3$, and $Eu_2O_3$ that alter the dispersion properties, color, and/or electrical conductivity; dyes such as methylene blue, crystal violet, and acid violet; biocides; preservatives; antifreeze agents; surfactants; and anti-foam agents. Metal dopants can be added as metal alkoxides, salts, or compounds during the hydrolysis of the vanadium oxide dispersions, or after the vanadium oxidi dispersions are formed.

The flexographic printing plate comprise a relief imageable element comprising a flexible substrate which preferably can transmit ionizing radiation, said substrate having on one surface thereof an optional primer layer of an aziridine functional composition and a radiation hardenable composition in a thickness of at least 0.3 mm. The antistatic layer is above the radiation hardenable composition and also may be above or below the optional primer. The plate is preferably imagewise irradiated to harden the composition in irradiated areas, said imagewise irradiated layer (and the overcoated antistatic layer with the optionally preferred pigmented radiation curable layer) preferably is contacted with an absorbent layer which can absorb unirradiated composition when it has been heated between 40° C. and 200° C. (or it may be wash-off developed), heating said composition layer may be heated to a temperature between 40° C. and 200° C. while it is in contact with said absorbent layer, that temperature being sufficiently high as to enable said composition in unirradiated areas to be absorbed by said absorbent layer (usually by flowing into said absorbent layer), allowing at least 75% by weight of said composition (which is unirradiated) in unirradiated areas to be absorbed by said absorbent layer, and removing said absorbent layer and said at least 75% by weight of composition from said flexible substrate. The process may further comprise a preferred step of irradiating said composition layer through the substrate with ionizing radiation to harden some but less than all of said composition layer and thereby form a hardened zone between said flexible substrate, primer, and unhardened composition before said at least 75% of said composition is allowed to be absorbed by said absorbent layer.

The preferred step of irradiating the composition from the backside of the element (i.e., through the substrate) is preferably done before the imagewise exposure to radiation to generate the floor or anchor zone before hardening through the depth of the composition layer. The ionizing exposure may be performed after imaging with beneficial effects, but without as great a benefit as exposure prior to imaging.

The purpose of the radiation curable top-coat is multifold. The layer improves the adherence of the Vanadium oxide layer to the printing plate. For this purpose, the top-coat layer need not be pigmented. The pigmentation provides a visual means for the printer to view the developed plate and image without going to press. This has become traditional in the printing art, and is a desirable commercial feature.

A novel class of radiation curable polyurethane elastomers are provided which are derived from polymer forming reactions of: (A) at least one diisocyanate (e.g., a diisocyanate or mixture of diisocyanates); (B) a first chain extension agent containing at least 2 free hydrogen containing groups, preferably at least 2 hydroxyl groups and at least one ethylenically unsaturated group per molecule; (C) an optional ingredient comprising a chain extension agent different from said first chain extending agent and containing at least 2 free hydrogen containing groups, preferably at least 2 hydroxyl groups and up to 11 carbon atoms; (D) a polyol having a molecular weight of at least 500 grams/mole which contains at least 2 free hydrogen containing groups such as at least 2 hydroxyl groups per molecule (said polyol preferably but not essentially having a solubility parameter less about 9.0), which resulting polyurethane elastomer has a number average molecular weight of at least 10,000 grams/mole, a melt transition temperature of less than about 180° C. and a melt index at 180° C. of at least 0.5 grams/minute (according to ASTM No.D 1238-70) with an 1,100 gram load and a 0.38 inch bore. The elastomer of the present invention may also be generally described as a radiation curable polyurethane elastomer having ethylenically unsaturated groups available for addition polymerization, said elastomer comprising the reaction product of (A) 10–50% by weight of at least one diisocyanate,
(B) 0.5–20% by weight of a first chain extending agent having at least two free hydrogen groups capable of polymerizing with isocyanate groups, and said first chain extending agent having at least one ethylenically unsaturated addition polymerizable group per molecule, and
(C) 10–70% by weight of an organic polyol having a molecular weight of at least 500 and containing at least two free hydrogen containing groups capable of polymerizing with isocyanate groups per molecule, said polyurethane elastomer having a number average molecular weight of at least 10,000 grams/mole, a melt transition temperature of less than 180° C. and a melt index at 180° C. of at least 0.5 grams/minute. These elastomers may optionally contain 0.5 to 20% by weight (preferably 0.75 to 12%) of a second chain extending agent different from said first chain extending agent and having at least two free hydrogen groups capable of polymerizing with isocyanate groups. The radiation curable polyurethane elastomeric compositions of the present invention are characterized as belonging to a general class of polymers known as segmented copolymers or multiphase polymers, which general class or classes have been well described in many references (e.g., *Multiphase Polymers*, Advances in Chemistry Series, Vol. 176, Stuart L. Cooper, and Gerald M. Estes, editors, 1978, pp. 1–83). The elastomeric properties of this class of polymers results from phase segregation or phase separation between so called "hard" segment domains and "soft" segment domains. The "hard" segment domains, which possess a melt transition temperature or temperatures above the use temperature of the elastomer (when used, for example, as a printing plate, the use temperature would be between about 15° C.–40° C.), act as reinforcing domains. The "soft" segment domains, which possess a glass transition temperature below the use temperature of the elastomer, act as a toughening phase which is able to dissipate energy by a process known as viscous energy dissipation. The two phases of the elastomer are thought to exist as seperate phases within the elastomer by virtue of thermodynamic incompatibility. The elastomers of the present invention are preferably able to display a percent swell of less than 2%, more preferably less than 1% and most preferably less than 0.5% in water. This property is readily measured by immersing the elastomer (e.g., 1 mm thick) in deionized water at 20° C. for twenty-four hours. If the thickness has increased less than 2%, there is less than 2% swell.

The novel radiation curable polyurethane elastomers which are produced from the above described polymer forming reactions are coated in layer form on a support sheet to provide an imageable photopolymer elastomer layered product. Following imagewise irradiation induced curing of the elastomer layer, and removal of the uncured elastomer portion of the elastomer layer, a flexographic printing plate is provided which is particularly useful in printing when combined with water based flexographic printing inks. A particularly important feature of the radiation curable elastomeric polyurethanes of the present invention is that the radiation curable feature derives from incorporation of the radiation curable functional groups into the polymer chains during the polymer forming reactions. These radiation curable groups are retained in the uncured state during the formation of the polymer chains, however, until activated by exposure to actinic radiation as will occur during the flexographic printing plate making process. The radiation curable functional groups are incorporated into the polymer chains by chain extending species (B).

The chain extension agents (B) useable according to the present invention include therein a reactive unsaturated moiety, preferably particularly sensitive to, and available for reaction upon curing via free radical reactions to generate cross-linking. Preferred unsaturation moities in chain extension agents according to the present invention are carbon-carbon double bonds (olefinic or ethylenically unsaturated bonds), and particularly preferred moieties are activated carbon-carbon double bonds. Generally, "activated" carbon-carbon double bonds in a class of chain extension agents utilizable according to the present invention include: double bonds activated through conjugation with a carbonyl group; those double bonds activated due to substitution by various other functional groups tending to stabilize free-radical formation and hence activate the double bond toward free radical reactions. In preferred chain extension agents according to the present invention, the "activated" double bond is oriented such that, when the chain extension agent is incorporated into the polymer backbone, i.e., between urethane or carbamate units, the activated double bond is in a portion of the polymer molecule remote from, or pendant to, the polymer backbone. That is, the activated double bond does not itself form part of the polymer backbone, but rather it is located on the polymer chain in a group pendant therefrom. A general chemical characteristic of chain extension agents according to the present invention is that they are di-hydroxy substituted organic compounds, which contain at least one activated double bond therein. Preferably no more than two hydroxy groups (that is, preferably less than an average of 2.10 and more preferably less than an average of 2.05 hydroxy equivalents per compound) are included in the compound, so that the chain extension agents do not generate substantial networking and cross-linking, during initial reaction with a polyurethane prepolymer to form the extended polyurethane polymer composition (uncured). As previously noted, these chain extending species may be di-free hydrogen containing compounds, which are inclusive of the di-hydroxy compounds. Useful free hydrogen containing compounds would have such groups as —SH, —NH$_2$, or —NHR (where R is an alkyl group or phenyl group) in place of one or more of the hydroxy groups. Hydroxy groups are especially preferred because of the resultant melting temperatures and melt indexes in the urethane product. The other free hydrogen reactant groups can produce polyurethanes having too high of a melt transition temperature or too low of a melt index. It is desirable to produce these polyurethanes with melt transition temperatures less than 155° C. (preferably less than 150° C.) and a melt index greater than 5 grams/10 minutes in the temperature range of 100° C. to 180° C. when measured according to ASTM No. D-1238-70 (preferably between 100° C. and 140° C.). Preferably, at least one and, most preferably, both hydroxy groups of the chain extension agent (B) are primary, so that reaction with isocyanate moieties to generate chain extension of growing polymer molecules will be relatively rapid, so as to compete effectively in reaction with other classes of chain extension agents, described below, utilizable to provide for other advantageous chemical and physical characteristics in the elastomeric composition. Preferred chain extension agents are those described in U.S. Pat. No. 4,578,504 and U.S. Pat. No. 4,638,040 having the structural formula wherein -X and -Y are hydroxyl and hydrogen respectively (1- or 2- glycerol acrylate or methacrylate) and those described in U.S. patent application Ser. No. 184,834 filed Apr. 22, 1988, in the name of J. A. Martens, et al. such as N,N-bis (2-hydroxyethyl), N'-(methacryloxyethyl) urea:

CH$_2$=C(CH$_3$)C(O)OCH$_2$CH$_2$NHC(O)N(CH$_2$CH$_2$OH)$_2$

In preferred compositions of the present invention, an activated double bond-containing chain extension agent is incorporated into a polymer to be cured such that, on the average, there is about 1 pendant, activated, unsaturation site provided every 2,000 to 10,000 molecular weight units in the polymer. For use in preferred applications such as flexographic printing plates, the number average molecular weight of chains in the polymeric elastomer (before curing) should be in the range of about 20,000 to 50,000, corresponding to weight average molecular weights in the range of about 35,000 to 95,000. In addition, the melt indices of the resulting molten radiation crosslinkable elastomeric compositions when measured according to ASTM No. D 1238-70 should be in the range of 0.5 grams/minute to 10.0 grams/minute in the temperature range from 100° to 180° C.

To show how the percentage of double bond contributing reagent added to the polymer affects the double bond equivalent weight of the polymer (the average molecular weight divided by the average number of double bonds pendant from the polymer), consider a polymer having one percent (1%) by weight of a double bond providing reagent in the reaction mixture with a polymer whose molecular weight provides a double bond equivalent weight of 16,000 in the product. By doubling (to 2%) the weight of the double bond providing reagent, the double bond equivalent weight is halved to 8,000. Using 2-glycerol methacrylate (GMA) as an example, in the same molecular weight polymer, the following relationship would exist for GMA versus equivalent weight (EW):

| % GMA | EW |
| --- | --- |
| 1% | 16,000 |
| 2% | 8,000 |
| 3% | 5,333 |
| 4% | 4,000 |
| 5% | 3,200 |

The polyol(D) of the reaction mixture, possessing a solubility parameter of less than about 9.0, is a hydrophobic polyol having as such a resistance to the imbibing of water and water/alcohol mixtures, and a hydroxyl equivalent weight of at least 250 gr./equivalent. Preferable polyols which can be employed herein are those polyether polyols which have an average hydroxyl functionality of from about 2 to 3 and an average hydroxyl equvalent of from about 250 to about 5000, preferably from about 500 to 3000, including mixtures of these polyols. Particularly suitable polyether polyols which can be employed include those which are prepared by reacting an alkylene oxide or halogen substituted alkylene oxide or mixtures thereof with an active hydrogen containing initiator compound. Suitable such oxides include, for example ethylene oxide, propylene oxide, 1,2-butylene oxide, 2,3-butylene oxide, epichlorohydrin, epibromohydrin, mixtures thereof and the like. When ethylene oxide is employed, it should not constitute more than 10% by weight of the polyol. Preferred oxides are 1,2-butylene oxide and epichlorohydrin. Such polyols are well known in the art of polyurethane chemistry and are commercially available. The poly 1,2-(butylene oxide) polyols are commercial products of the Dow Chemical Company. The polyepichlorohydrin polyols are described in U.S. Pat. No. 4,431,845 and are commercial products of the 3M Company.

The organic diisocyanate or diisocyanates (A) are selected from organic aromatic or aliphatic diisocyanates or mixtures thereof. Suitable organic aromatic diisocyanates which can be employed include, for example, any such isocyanate having 2 or more NCO groups per molecule such as for example 2,4-toluenediisocyanate, 2,6-toluenediisocyanate, p,p'-diphenylmethanediisocyanate, p-phenylene diisocyanate, naphthalenediisocyanate, polymethylene polyphenyl isocyanates, 1,3,3,5-tetra methyl- 1,6-bis- (isocyanato)hexane (TMXDI), mixtures thereof and the like. Suitable organic aliphatic polyisocyanates include in addition to the hydrogenated derivatives of the above mentioned organic aromatic polyisocyanates, 1,6 hexamethylene diisocyanate, 1,4-cyclohexyldiisocyanate, 1,4-bis-isocyanatomethyl-cyclohexane, isophorone diisocyanate, mixtures thereof and the like. Preferred isocyanates are the cycloaliphatic diisocyanates which include 4,4'-bis(isocyanato cyclohexyl) methane, 1,4-cyclohexyl diisocyanate, and isophorone diisocyanate.

Suitable chain extension agents (C) which can be employed include hydroxyl-containing aliphatic compounds which contain at least 2 but not more than 3 hydroxyl groups per molecule. Suitable hydroxyl-containing chain extenders include, for example, ethylene glycol, propylene glycol, 1,4 butane diol, diethylene glycol, dipropylene glycol, triethylene glycol, tetraethylene glycol, glycerine, trimethylol propane, low molecular weight ethylene and/or propylene oxide derivatives of glycerine, or trimethylol propane and the like.

The radiation curable elastomer composition may contain, in addition to the above described components, other components or adjuvants such as photoinitiators, colorants, fillers, catalysts, stabilizers and inhibitors, such as may be desired to impart other properties to the curable elastomer layer such as storage stability, visible color, etc. Such adjuvants may be incorporated into the polymer backbone as by reaction or may simply exist as additives to the overall composition not incorporated into the polymer chain.

As is well known in the art, ethylenically unsaturated bonds (like those which can be pendant from the elastomers used in the present invention) can be cured directly with ionizing radiation such as e-beams and other high energy radiation). It is not essential that initiators be present in the composition of the invention, but it is highly desirable. Preferably any of the known classes of photoinitiators, particularly free radical photoinitiators such as the quinones, benzophenones, benzoin ethers, aryl ketones, peroxides, biimidazoles, diaryliodoniums, triarylsulfoniums (and phosphoniums), diazoniums (especially the aromatic diazoniums), etc. may be used in the compositions of the present invention, generally in amounts of from 0.1 to 154 by weight, preferably from 0.3 to 104 by weight, more preferably from 0.5 to 8% by weight of the elastomer. The photoinitiators may be used as mixtures of different initiators and/or in combination with dyes that are well known in the art to sensitize or spectrally sensitize the photoinitiators.

Another desirable aspect of preferred compositions useful in the practice of the present invention is that lower molecular weight polyacryloyl (including methacryloyl) materials are not needed in the composition. Such polyacryloyl materials (di-, tri-, tetra-, penta-, hexyl-acryloyl or methacryloyl) are undesirable for a number of reasons. The present invention has no problem operating completely free of polyacryloyl (which includes methacryloyl) compounds with molecular weights of 1000 or less. From many manufacturing standpoints it is especially desirable to have crosslinkable compositions with less than 2.0% by weight of such polyacryloyl compounds. The present invention preferably has less than 2.0% of such compounds, more preferably less than 1.04, still more preferably less than 0.5%, and most preferably 0% of polyacryloyl materials with molecular weights less than or equal to 1000.

The radiation curable polyurethane elastomeric compositions of the present invention are preferably produced utilizing melt polymerization techniques. Polymerization in the melt avoids the use of organic solvents and solvent mixtures producing an elastomer product which can be applied directly to the support sheet in molten form without concern for drying ovens which would otherwise be necessary to remove such organic solvents from the elastomeric layer prior to making flexographic printing plates. A preferred method of producing these compositions involves use of a polymer processing melt extrusion device, such as a twin-screw counter rotating extrusion device, as the polymerization reactor (such as disclosed in U.S. Pat. No. 4,843,134). Such an extrusion device provides for temperature control, thorough mixing of reacting species, and control of the pressure profiles down the extruder during processing which affects backmixing of and the resulting residence time distribution of the reactants. Upon completion of the radiation curable elastomer forming reactions in the extruder, the molten, fully reacted, uncured thermoplastic elastomer composition can be applied directly to the support sheet via passage through a film forming extrusion die followed by contacting a moving web of the support materials. The molten uncured elastomer also can be collected as pellets, or in some other solid form (slabs) for later processing into flexographic printing plates using other forms of processing such as conventional single screw melt extrusion processing.

For the purpose of producing a flexographic printing plate having excellent durability (press life), and resistance to delamination of the elastomeric layer from the support layer or sheet, it is generally desirable to enhance the adhesion or bonding strength of the cured elastomer layer to the support sheet utilizing priming agents or adhesion promoting treatments which are applied to the film or metallic support layer prior to application of the radiation curable elastomeric layer. Such treatments are generally done to the surface of the support layer or sheet prior to application of the molten curable elastomeric layer. Treatments such as corona discharge treatments, laser modification as in U.S. Pat. No. 4,822,451, application of chemical priming agents, or mechanical roughening of the surface are effective in somewhat increasing adhesion of the curable elastomeric layer to the support. Yet in the practice of the present invention, these treatments have not been able to provide the best results contemplated for the technology. The use of the aziridine functional compounds have been found to improve the performance of these sheets.

Following the completion of fabrication of the radiation curable polyurethane elastomeric composition into a planar contiguous layer in contact with a support sheet (film or metallic base), flexographic printing plates can be produced by imaging and development. This is accomplished by curing the polyurethane elastomeric layer by exposure to actinic radiation, which exposure acts to harden or crosslink the elastomeric layer rendering it more or less unmeltable or insoluble in the irradiated areas. The exposure to actinic radiation can be done in several ways. In a preferred method, th curing is accomplished in two exposure steps. The first exposure, called the backside exposure, is done with actinic radiation being directed toward and through the support layer into the elastomeric layer with the actinic radiation source positioned adjacent to but seperated from the support layer side of the two-layered plate being exposed. This exposure causes a gradation of curing or crosslinking of a portion of the curable elastomeric layer, the curing being most complete nearest the support layer. The time duration of the backside exposure is determined experimentally and is chosen so as to cause a gradient of cure within the radiation-sensitive elastomeric layer. The highest level of cure (crosslinking) of the elastomeric layer occurs nearest the support layer, with the cure levels being reduced as the distance within the elastomeric layer, as measured from the support layer, increases. A so-called gradient cure takes place during this exposure step, the gradient resulting from a fall off or reduction in effective actinic radiation intensity within different levels of the elastomeric layer. This reduction occurs by virtue of at least partial absorption of actinic radiation by the elastomeric layer, as measured within the curable elastomeric layer. Following this brief exposure step (brief as compared to the imagewise exposure step which follows), an imagewise exposure is accomplished utilizing a photographic negative mask which is placed in contact with the elastomer layer and through which actinic radiation is directed. This brief backside exposure is preferably done with ionizing radiation and is not done with such radiation or intensity as would generally activate all free radical photoinitiators within the elastomeric layer. One can readily test the material to determine if there has been crosslinking or differential crosslinking by common testing procedures such as those shown in U.S. Pat. No. 4,576,850 (Gel Swell measurements).

A vacuum frame exposure device is preferred for such imaging (as opposed to the brief) exposure, which is accomplished following thorough exhausting of air from between the elastomer layer and the photographic negative. The exposure to actinic radiation in an imagewise manner is then accomplished, with the exposure of sufficient duration as to render the curable elastomeric layer essentially unmeltable or insoluble under reasonable conditions of flexographic plate use.

In the most preferred method for forming the graded-cure radiation curable elastomeric layer, the radiation curable elastomeric planar contiguous layer is exposed to ionizing radiation from an electron beam source with the accelerated electrons being directed toward and through the support layer into the elastomeric layer with an energy insufficient to penetrate the entire curable elastomeric layer.

Preferably less than 75% of the ionizing radiation would penetrate through a thickness of 50% of the curable elastomeric layer. In this way, the curing, or hardening of the elastomeric layer is only partially effected with the curing being most complete at the interface of the elastomer layer with the support layer or sheet and being incomplete at the outer surface (surface away from the support sheet) of the planar contiguous elastomeric layer. By regulating or otherwise controlling the penetrating power of the electron beam irradiation source, as by controlling the potential energy field through which the accelerating electrons are passed, the pathlength of the electrons through the support sheet and elastomeric layer is controlled. The backside preimaging cure process step can provide a continuous, relatively thin layer of cured elastomeric composition strongly bonded to the substrate. This thin cured layer can act as a footing or support surface for later generated image features. Particularly with respect to small details, e.g., 1 or 22 dots, the footing physically strengthens the adherence of the small features or details and reduces their tendency for wear or premature removal from the plate. This increases the detailed printing life of the flexographic plate.

In the preferred method, following electron beam exposure, an imagewise exposure of the radiation curable elastomeric layer is accomplished. This exposure is most preferably accomplished by exposure of the curable elastomeric layer to actinic radiation through a photographic negative mask which is placed in contact with the elastomer layer and through which actinic radiation is directed. A vacuum frame exposure device is preferred for such exposure, which is accomplished following thorough exhausting of air from between the elastomer layer and the photographic negative. The exposure to actinic radiation in an imagewise manner is then accomplished, with the exposure of sufficient duration as to render the curable elastomeric layer essentially unmeltable or insoluble.

Following imagewise exposure to actinic radiation, the development of the relief structure is accomplished by removal of the uncured portions of the elastomer layer. In the preferred method of removal, an absorbant sheet material is utilized in the following manner. The photographic negative mask is removed from the elastomer layer, and replaced with an absorbant sheet material. The absorbant material is selected from non-woven web materials, paper stocks, fibrous woven web materials, open-celled foam materials, porour sheets, or other sheet materials which contain, more or less, a substantial fraction of their included volume as void volume. The uncured elastomer layer is heated by conduction, convection, or other heating methods to a temperature sufficient to effect melting. By maintaining more or less intimate contact of the absorbant sheet material with the molten elastomeric layer (molten in the uncured regions), a transfer of the uncured elastomer from the planar contiguous layer to the absorbant sheet material takes place. While yet in the heated condition, the absorbant sheet material is seperated from the cured elastomer layer in contact with the support layer to reveal the relief structure. After cooling to room temperature, the resulting flexographic printing plate can be mounted on a printing plate cylinder and tested on a printing press as to printing capability.

Preferred absorbant sheet materials utilized to remove the uncured portions of the elastomeric layer from the cured portions of said layer are selected from absorbant materials which possess internal strength and tear resistance at temperatures up to, including, and slightly beyond the melting temperature of the uncured radiation curable polyurethane elastomeric composition, and which furthermore possess a high absorbancy for the molten elastomer composition as measured by the grams of elastomer which can be absorbed per milliliter of absorbant material. Preferred absorbant sheet materials, which may be referred to as development receptor sheets, are blown microfiber non-woven web materials produced from high temperature melting polymeric materials such as polypropylene, polyester, nylon or other high termperature melting thermoplastic polymers. The melting or softening temperature of the absorbant sheet material utilized should be higher than the melting or softening temperature of the radiation curable polyurethane elastomer utilized in the planar contiguous layer of the flexographic printing plate being produced. Additional absorbant sheet materials which can be utilized according to the present invention include absorbant stocks produced by various paper making processes. Absorbant materials such as open-celled thermoset foams are also acceptable. Preferred absorbant sheet materials contain a void volume fraction of at least 50% of the included volume of the sheet (as measured in the uncompressed condition). The most preferred absorbant sheet materials are spun-bonded nylon non-woven webs such as CEREX ™ non-woven webs produced by the James River Corporation. Inorganic filament webs, particularly those with porous filaments, may also be used.

In the use of the term absorption in defining the relative physical property between the development receptor sheets and the melted uncured elastomeric composition, no particular limitation on absorptive phenomena is intended. There need not be penetration of the melted composition into the body of fibers, filaments or particles. The absorption into the bulk of the development receptor may be only by surface wetting of the interior bulk. The driving force for the movement of the melted elastomeric composition into the absorptive area of the development receptor may be one or more of surface tension, electrical (e.g., van de Waals forces), polarity attraction, or other physical forces known to assist in promoting philicity, adsorption or absorption of materials.

In summary, the curable polyurethane elastomeric compositions according to the present invention comprise the reaction products of: 1) an organic diisocyanate composition, which may include a mixture of diisocyanates; 2) a chain extension agent composition including an effective amount of a difunctional hydroxyl reactant containing a carbon-carbon double bond; and 3) a polyol having a molecule weight of at least 500 grams/-mole and at least 2 hydroxyl groups which upon reaction of at least those three ingredients generates curable polyurethane elastomeric compositions particularly useful in their cured forms as flexographic printing plate compositions. The invention also describes flexographic printing plate materials comprising a cured polyurethane elastomeric composition having adhered thereto a substrate, which flexographic printing plate materials are produced via a solventless absorption process method utilizing an absorbant sheet material to remove the uncured elastomer portions of the adherant elastomer layer.

It is to be understood that the disclosures made herein are merely exemplary of the invention, which may be embodied in various forms and systems. Therefore, specific details disclosed herein are not to be interpreted as limiting unless so specified. Rather, as the disclosure should be considered support and a representative basis for teaching one skilled in the art to variously practice the present invention in appropriate systems and manners.

The present invention includes within its scope: improved curable polyurethane elastomeric resin compositions; certain cured elastomeric compositions; methods for producing improved flexographic printing plate materials from these curable elastomeric compositions; improved flexographic printing plate materials produced from the improved compositions and an improved method of manufacture and use, and an improved primer layer. The primer compositions are particularly well suited for use as flexographic printing plates when used in conjunction with a support layer or sheet to which they are adhered.

The aziridine functional material is used as at least 10% by weight solids of the primer layer. The aziridine-functional material may be diluted with solids that comprise inert compatible polymeric organic binders, coupling agents, particulates, comonomers, other priming agents, and the like. It is preferred that the aziridine comprise at lest 40-70% by weight solids of the layer, more preferably at least 90% by weight of the layer and most preferably 100% by weight of the solid content of the layer.

The aziridine-containing compound may also contain other functional groups. Preferably these groups are not reactive with the aziridine functionality under ambient conditions. Thus, for example, the aziridine-functional compound may also contain one or more hydroxyl groups.

The aziridine-functional compounds useful in the present invention may be represented by the formula

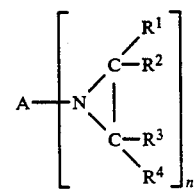

wherein A is an n-valent organic or inorganic group, n is a whole number of at least one (preferably 2 to 4), and $R^1$, $R^2$, $R^3$, and $R^4$ may be the same or different and are individually selected from the group consisting of hydrogen and lower alkyl (branched or straight chain) groups containing from 1 to 8 (preferably from 1 to 4) carbon atoms.

The nitrogen atom of the aziridine group is preferably linked to an atom having a valence of 4 to 5 (most preferably C or P). Preferably, $R^1$, $R^2$, and $R^3$ are each hydrogen and le is selected from hydrogen and alkyl containing from 1 to 4 (most preferably 1 to 2) carbon atoms.

"A" may be an aliphatic, aromatic or alicyclic organic radical which may contain atoms such as oxygen, sulfur, nitrogen, etc. "A" may also be an inorganic radical, such as

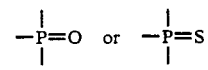

"A" preferably is

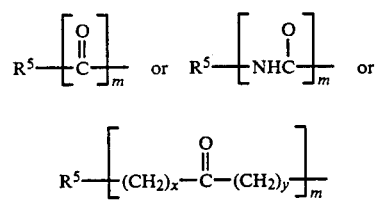

where $R^5$ is an m-valent aliphatic, aromatic or alicyclic radical which may contain atoms other than carbon, e.g., oxygen, nitrogen or sulfur, m is a whole number of at least 1, and x and y are individually 0, 1, or 2.

Specific examples of useful aziridine-containing materials include

A. "CX-100" available from Polyvinyl Chemical Industries and believed to have the formula

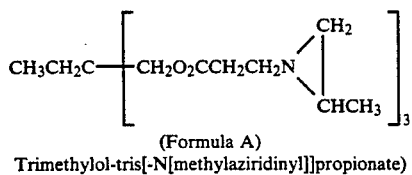

(Formula A)
Trimethylol-tris[-N[methylaziridinyl]]propionate)

B. "XAMA-7" available from Cordova Chemical Company and believed to have the formula

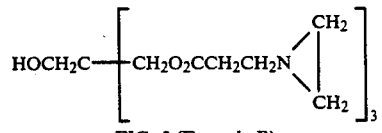

FIG. 5 (Formula B)
(Pentaerythritol-tris-(B-(N-Aziridinyl)Propionate)

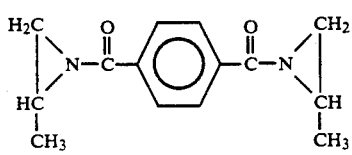

FIG. 6 (Formula C)
(1,1'-(1,3-phenylenedicarbonyl)bis[2-methyl aziridine])

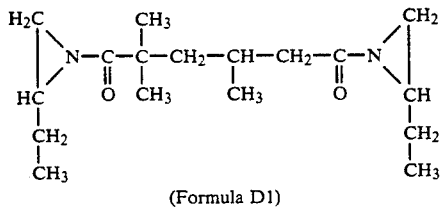

(Formula D1)

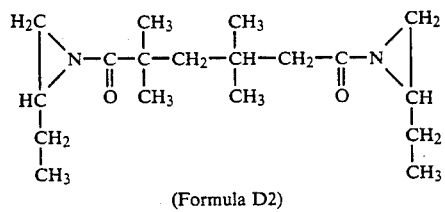

(Formula D2)
(1,1'-trimethyladipolyl bis[2-ethylaziridine])

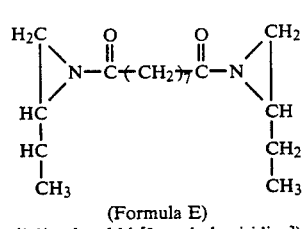

(Formula E)
(1,1'azelaoyl bis[2-methyl aziridine])

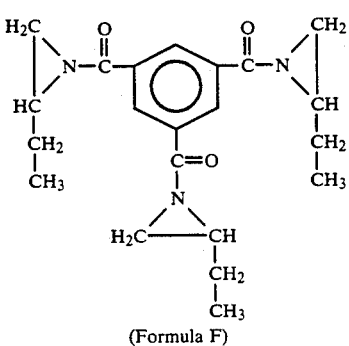

(Formula F)

-continued
(1,1',1''-(1,3,5-benzenetriyltricarbonyl)-tris[2-ethylaziridine])

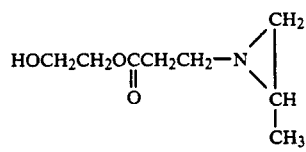

(Formula G)
(2-hydroxyethyl-3-(2-methyl aziridinyl)-propionate)

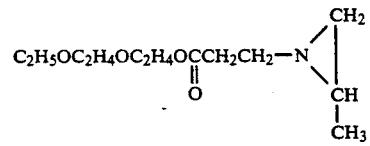

(Formula H)
(Ethoxy ethoxy ethyl-3-(2-methyl aziridinyl)-propionate)

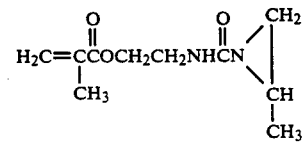

(Formula J)
(2-methyl aziridinyl-2-(2-methyl propenoyloxy)ethyl urea)

The aziridine-functional layer may vary in thickness if desired. However it has been found that this layer should have a calculated thickness of more than about 0.075 g and more preferably more than about 0.1μ. Although the layer may be as much as about 1 g thick, no advantage has been noted at thicknesses of greater than about 0.4μ thick. Preferably this layer is from about 0.1 to 0.4μ thick.

The film of the invention may be readily prepared. For example, the surface of the first layer may be preferably cleaned to remove dirt and grease using known cleaning techniques. The surface may then be contacted with a composition containing the aziridine-functional material using a variety of techniques such as Meyer rod coating, brushing, spraying, roll coating, curtain coating, knife coating, etc., and then processed at a time and for a temperature so as to provide the aziridine-functional layer.

A wide range of processing temperatures may be used to apply this layer. The particular temperature employed must not be so high as to degrade either the surface being treated or the aziridine functionality. Typical processing temperatures range from 15° to 250° C. Preferably the treated surface is processed at a temperature of from 70° to 140° C.

The treatment composition may comprise either the aziridine compound alone, a water or solvent solution of the aziridine, or a dispersion of the aziridine. The treatment composition typically comprises from about 0.02 to 15 (and preferably from about 0.2 to 1) percent by weight of the aziridine.

If water is employed as the liquid vehicle, it is preferred that a surfactant material also be included in the treatment composition. The surfactant may comprise up to 0.06 times the weight of the aziridine component in the treatment composition. Anionic, cationic, non-ionic, or amphoteric surfactant materials may be employed. Examples of useful surfactants include octylphenoxy ethanol, alkylaryl polyethersulfonates, ethoxylated fluorochemical alcohols, fluoroaliphatic polyesters, etc.

While the aziridine-functional composition employed in the present invention consists essentially of the aziridine compound, it is permissible to employ other ingredients such as slip agents, colorants (e.g., dyes and pigments), antioxidants, UV light stabilizers, and the like, (at up to 50 weight percent of the composition). Additionally, organic resins may also be added to up to 90 weight percent of the aziridine material may be employed as discussed above. These ingredients are essentially non-reactive with the aziridine under normal conditions. If reactive ingredients are employed, they must be present in amounts insufficient to prevent interaction between the substrate surface and the aziridine group.

CURABLE POLYURETHANE ELASTOMERIC COMPOSITIONS

The polyurethane elastomeric compositions according to the present invention include a chain extension agent incorporated into the backbone of a polyurethane polymer, the chain extension agent including therein, and preferably pendant to the polymer backbone, an unsaturation site available for cross-linking the polymer upon irradiation cure. Typically, for preferred embodiments, the unsaturation site is an activated carbon-carbon double bond.

Preferred polyurethane elastomeric compositions useful according to the present invention are formed from the following constituents:

(a) an organic diisocyanate;
(b) a preferred chain extension agent according to the present invention having incorporated therein an unsaturation site preferably displaced from the polymer backbone by a spacer group or groups so as to be pendant to the polymer chain following incorporation;
(c) a dihydroxy functional chain extender, preferably containing 2-8 aliphatic carbon atoms, as a reinforcing agent to promote toughness in the polymer;
(d) a hydrophobic macroglycol or higher molecular weight polyol having a molecular weight in the range from about 500 to about 5000 grams/mole, which provides elasticity and energy dissipation capability in the polymeric composition when incorporated between the rather hard urethane segments.

It should be readily understood that the above four constituents may be varied in structure and relative amounts in the curable compositions, in a manner permitting production of elastomeric compositions having a wide variety of chemical and physical performance properties. Desired uncured and cured properties can be readily obtained, and predictably and consistently generated. For example, by varying the relative amounts of diisocyanate (a), and short chain extending diols (b) and (c) as a proportion by weight of the total mass of the curable composition, the durometer or Shore hardness of the elastomer can be varied and controlled. Furthermore, by varying the proportion by weight of the chain extending species (b) to the total mass of the elastomer composition, the cross-link density (average molecular weight between crosslink sites) can be controllably and predictably varied in the cured composition.

Organic diisocyanates useable in forming elastomeric polyurethane compositions according to the present invention may be of a variety of types. Generally, aromatic or cycloliphatic diisocyanates having an average molecular weight of about 160 to about 450 are preferred. These include, for example:

4,4'-di(isocyanatophenyl) methane
4,4'-di(isocyanatocyclohexyl) methane
2,4-toluene diisocyanate
2,6-toluene diisocyanate
p-phenylene diisocyanate
1,4-di(isocyanato) cyclohexane
isophorone diisocyanate The remaining above described chemical reactant constituents utilized in forming the elastomeric polyurethane compositions generally comprise diols, each having preferred characteristics to impart certain desired chemical and physical properties to the resulting polyurethane elastomer. A first of these is a chain extending diol component having a relatively low hydroxyl equivalent eight, mentioned above as component (c), which reacts with isocyanate moities to form relatively short-chain, hard, tough, segments in the backbone of the polyurethane polymer. Preferred diol components (c) are: 1,2-ethylene glycol; propylene glycol; 1,4-butane diol; diethylene glycol; dipropylene glycol; and triethylene glycol.

The relatively high molecular weight macroglycol (polyol) component (d) utilized in preparing the polyurethane elastomeric compositions according to the present invention are extended chain diols, which, following reaction act as soft, low Tg, energy dissipating, hydrophobic segments in the resulting polyurethane elastomers. Suitable macroglycols which can be utilized are those polyether polyols having an average hydroxyl functionality of 2 to 3 and an average hydroxyl equivalent weight of from about 250 to about 5000, preferably from about 1000 to about 3500. Suitable polyether polyols which can be employed include those which are prepared by reacting an alkylene oxide, or halogen substituted alkylene oxide or mixtures thereof with an active hydrogen containing compound. Prefered oxides are 1,2-butylene oxide and epichlorohydrin either alone or in combination.

Improvements according to the present invention can also result from incorporation of yet a third class of diol compound into the polymer forming reaction mixture. This optional third class of diol compound may be used to introduce further characteristics to the resulting polyurethane elastomeric composition. In particular, the third class of component comprises a relatively low molecular weight chain extension agent which is difunctional in hydroxyl groups and also includes an unsaturated moiety, generally pendant to the resulting polymer chain. In a surprising aspect, by judicious selection of this species with particular regard for its structural features, this unsaturated diol provides a dual function of being both a curable moiety which provides for radiation curability but also, and just as important, a reduction of the melting temperature of the elastomeric composition to temperatures as low as about 85° C. These features further enable the production of a flexographic printing plate produced via irradiation induced curing of the elastomeric composition, followed by removal of the uncrosslinked elastomer portions by absorption by an absorbant material at temperatures above the melting point of the uncured elastomeric composition, which temperatures are well below the heat distortion temperatures of the support layer beneath the cured elastomeric layer in the printing plate.

Preferably the unsaturated diol comprises an unsaturation site with an activated carbon-carbon double bond. This activated double bond is thus readily available and particularly reactive for cross-linking reaction upon exposure to activating irradiation.

The term "activated", or variants thereof when used in association with an unsaturated moiety of an agent according to the present invention, refers to a basic type of unsaturation site which is activated in the sense that free radicals formed thereat will be stabilized by other groups in the molecule, hence facilitating the free radical reaction. Such activated double bonds include, for example, the carbon-carbon double bonds of alpha-beta unsaturated carbonyl compounds, for example acrylates, methacrylates, and acrylamides.

Preferred activated unsaturation moiety-including chain extending diols include: 1-, or 2-glycerol acrylate or methacrylates; trimethylolethane monoacrylate or methacrylate; and N,N-bis(2-hydroxy ethyl)-N'-(methacryloxyethyl) urea.

In curable elastomeric compositions according to the present invention, generally at least 1 activated unsaturation moiety should be introduced for about every 1500–15,000 or preferably every 2,000–10,000 molecular weight units of elastomer polyurethane. This can be readily controlled and repeated and is a function of the reactivity and/or amount(s) of reactant(s) used in forming the polyurethane. Substantially higher quantities of unsaturation moiety may lead to a relatively highly crosslinked, and therefore brittle, cured composition. Such a composition may have utility in many applications, but not typically those involving a resilient flexographic printing plate. Substantially less incorporation of unsaturated moieties will generally result in insufficient cross-linking or cure of the elastomer as required to resist flow above the elastomer melt transition temperature which flow will result in permanent undesired distortion of the printing plate surface rendering the printed matter produced from it as unacceptable.

FORMATION OF THE CURABLE ELASTOMERIC COMPOSITIONS

The curable elastomeric compositions can be produced by any of a number well known solvent based or melt polymerization techniques. Melt polymerization techniques such as one shot, prepolymer with hand casting, reaction injection molding, or reactive extrusion techniques, are preferred since these methods can eliminate solvents and solvent drying.

Particularly preferred techniques are those involving reactive extrusion utilizing multi-screw extrusion equipment such as counter rotating twin-screw extrusion equipment.

The percent by weight change of the cured elastomer composition when immersed in various liquids is determined by the following procedure:

Test strips of cured elastomer of dimensions 12.7 mm×25.4 mm×0.4 mm are weighed to the nearest 0.0001 gram (S1). The strips are then placed in sufficient liquid as to be fully immersed and equilibrated for 24 hours. After careful removal using a forceps, excess liquid is removed from the test strip using an absorbant towel, and the strip is reweighed to the nearest 0.0001 gram (S2). The percent of swelling (% Swell) is calculated by the following equation:

$$\% \text{ Swell} = \frac{S2 - S1}{S1} \times 100$$

The percentage of gell (% Gel) after curing the elastomer compositions is determined by the following procedure:

Test strips 12.7 mm×102 mm×0.4 mm are weighed to the nearest 0.0001 gram (G1). The strips are immersed in 50 grams of tetrahydrofuran and allowed to soak for 24 hours. The swollen strips are carefully removed from the solvent using a forceps, excess solvent is removed from them with an absorbent material and the strips are placed in a preweighed aluminum pan. The strips are allowed to air dry for 8 hours followed by drying for 8 hours in a vacuum oven maintained at 80° C. and 29 inches of mercury vacuum. The strips/pan are re-weighed with the gel weight (G2) being determined by difference. The % Gel is calculated as follows:

$$\% \text{ Gel} = \frac{G2}{G1} \times 100$$

The storage modulus, E', loss modulus, E'', and loss tangent $\sigma$, of the elastomeric compositions are determined utilizing commercially available measuring equipment, in this case a Rheovibron Analyzer (product of the Toyo-Baldwin Co.- Tokyo, Japan) using the following procedure:

Test strips of approximately 3.8 mm×70 mm×0.4 mm are placed between the jaw clamps of the Rheovibron apparatus. The sample is tensioned slightly and then cooled to −50° C., at which point a sinusoidal tension is applied from the driver side of the apparatus at a frequency of 11 Herz while the sample temperature is elevated at the rate of +3° C. per minute. The resulting tension applied through the sample to the other support arm and its phase shift in degrees from the driving tension are measured and used to calculate E', E'', and Tan $\sigma$ (tangent of the angle $\sigma$).

The melt index of the molten uncured elastomer compositions is determined according to ASTM No. D 1238-70 as follows. Five (5.0) grams of elastomer pellets are loaded into the heated chamber of a Tinius-Olsen Extrusion Plastometer, which chamber is equilabrated at a temperature of 153°+/−0.5° C. A load of 1100 grams mass is applied to the melting elastomer in the chamber, which load acts to force the molten elastomer composition from the small orifice at the bottom of the Plastometer chamber. After 5 minutes, during which period the polymer flow tends toward equilibrium, a sample of extruded elastomer is collected over a 20 second interval and weighed as M1. The melt index is then calculated using the following equation:

Melt Index=M1×30 [having the units of grams/10 minutes]

EXAMPLE 1

An aqueous coating solution consisting of a 0.3% by weight suspension of vanadium oxide in water with a trace of Triton X-100 surfactant was coated on a 3.8 mil polyester film using a B&M coating bar. The dried coating weight was approximately 35 mg/m² and was controlled by operating at the minimum flow rate (from the Zenith pump) which would produce a void free wet coating observed as the moving web exited the coating zone and before drying began. Following oven drying (at 200° F.), the pigmented solvent based top coat solution was applied using the same coating method. The desired coating weight of top coat plus antistat was varied from 480 to 660 mg/sq. ft. The lamination of top coat/antistat was accomplished during a flexographic plate extrusion run. The data on charge decay shown below was obtained from samples selected from this experimental run.

The invention consists of a layer of amorphous vanadium oxide preferably between a cover sheet (strippable) and the pigmented top coat of the flexographic plate product construction.

| INVENTION CONSTRUCTION | |
|---|---|
| Cover Sheet (4 mil PET) | |
| *Amorphous V₂O₅ | |
| Pigmented Top Coat | |
| Urethane Elastomer Image Layer | |
| Primed Support Sheet (7 mil PET) | |

*New layer provides anti-static properties to entire product construction as follows:

| | Time to Dissipate 5 KeV Applied Charge (sec) |
|---|---|
| Comparative Construction (identical but no vanadium oxide layer) | ∞ |
| Invention Construction | <0.1 |
| Invention Construction (Cover sheet removed) | <0.1 |
| Cover sheet only (after removal) | ∞ |

EXAMPLE 1A

Curable Elastomer Composition from 2-Glycerol Methacrylate Unsaturated Diol and Poly 1.2-(butylene oxide) Diol A radiation curable polyurethane elastomeric composition was prepared in a twin-screw extrusion reactor as follows:

I. A polyol mixture was prepared of the following components which were thoroughly mixed in a feed tank until homogenious:
  A. 286.1 parts (0.2861 moles) of a 1000 molecular weight poly 1,2-(butylene oxide) diol (Dow Chemical Co.);
  B. 32.8 parts (0.3644 mole) of 1,4-butane diol (GAF Chemical Co.)
  C. 10.7 parts (0.0669 mole) of 2-glycerol methacrylate (3M Co.);
  D. 10.6 parts of diethoxy acetophenone (Irgacure-651, Ciba-Geigy Co.)
  E. 0.1 part methylene blue
  F. 0.06 part ferric chloride
  G. 0.26 part dibutyl tin dilaurate II. A precision flow metering system was utilized to meter the above polyol stream into the inlet port of a 64 mm twin-screw counter rotating extruder (Leistritz Co.) at a ratio of 62.47 parts by weight of polyol stream to 37.53 parts by weight 4,4'-bis(isocyanato cyclohexyl) methane (Desmodur W TM, Mobay Chemical Co.). At this mass ratio, there was a slight equivalency excess of isocyanate moities in the feed stream relative to hydroxyl moieties. The reaction temperature of the polymerizing mass was maintained in the range of 150° to 170° C. as polymerization occurred in the extruder. Upon exiting from the extruder, the fully reacted curable elastomer composition was segregated into pellets having diameters of approximately 0.3 cm which were collected for further processing. The completeness of the polymerization reaction was determined by monitoring the infrared spectrum of a cast film of the curable elastomer product and determining the absorbance ratio of the —NCO absorption band (2250 cm−1) to the —CH2— absorption band (2950 cm−1). A ratio of less than 0.2 indicated a complete reaction with only a slight excess of —NCO groups remaining. The melt index of the curable elastomer composition was monitered at a temperature of 153° C. using a load of 1100 grams on the heated chamber of the Extrusion Plastometer and found to be in the range between 10 and 20 grams per 10 minute interval.

The fully reacted curable polyurethane elastomeric composition 1A consisted of the following mole ratios of constituents:

| Component | Moles |
|---|---|
| 4,4'-bis(isocyanato cyclohexyl) methane | 2.730 |
| 1,4 butane diol | 1.274 |
| 2-glycerol methacrylate | 0.234 |
| poly 1,2 (butylene oxide) diol | 1.000 |

Experimental Examples

Vanadium oxide colloidal dispersions were prepared as described below. Coating dispersions, i.e., vanadium oxide colloidal dispersions suitable for coating, were prepared with successively greater dilution (each successive coating dispersion was one half the concentration of the previous coating dispersion). coatings were prepared by hand spreading using a No. 3 Mayer bar onto poly(vinylidene chloride) (PVDC) primed polyester film (available from Specially Film Division, 3M Company, St. Paul, Minn.). Each subsequent vanadium oxide coating had one-half the surface vanadium concentration, i.e., coating weight, as the previous one. The effectiveness of the vanadium oxide colloidal dispersions for the preparation of antistatic coatings was determined as the surface concentration of vanadium ($[V]_{off}$, in mg of vanadium per m² of substrate surface area) required to provide an electrostatic charge decay time of less than 0.10 second for decay of a 5000 V potential to less than 50 V. The surface concentration of vanadium reported in the following examples was calculated from formulation data assuming the density of each successively diluted vanadium oxide colloidal dispersion to be that of water (1.0 g/mL), and the wet coating thickness obtained with the No. 3 Mayer Bar to be 6.86 μm. An Inductively Coupled Plasma (ICP) Spectroscopic analysis of vanadium surface concentration of several coated film samples showed that the actual vanadium surface concentration was consistently about 40% of that calculated from the amount coated from a particular concentration of coating dispersion. Times required for decay of a 5000 V charge (to less than 50 V) were determined using a model 406C Static Decay Meter from Electro-Tech Systems, Inc., Glenside, Pa. Concentrations of $V^{4+}$ were determined by titration with standardized $KMnO_4$ solution, with the endpoint determined visually by the persistence of unreacted permanganate.

The deionized water used in the examples below was prepared by pumping well water through a cation exchange bed (regenerated with sulfuric acid) and then through an anion exchange bed (regenerated with NaOH). The cation exchange resins used were sulfonated polystyrenes crosslinked with vinyl benzene, and the anion exchange resins used were quartenary ammonium styrenes crosslinked with vinyl benzene. These resins are commonly available under the trade designation AMBERLITE ™ from Rohm & Haas, Philadelphia, Pa. In the process, cations were exchanged for H+ ions and anions were exchanged for OH ions. After passing through the exchange resins, the water was held in a tank prior to use.

EXAMPLE 1

A vanadium oxide colloidal dispersion was prepared by adding VO(O-$i$-Bu)$_3$ (15.8 g, 0.055 mol, product of Akzo Chemicals, Inc, Chicago, Ill.) to a rapidly stirring solution of H$_2$O$_2$ (1.56 g of 30% aqueous solution, 0.0138 mol, product of Mallinckrodt, Paris, Ky.) in deionized water (252.8 g), giving a solution with a vanadium concentration of 0.22 mole/kg (1.1% vanadium). Upon addition of VO(O-$i$-Bu)$_3$, the mixture became dark brown and gelled within five minutes. With continued stirring, the dark brown gel was broken up giving an inhomogeneous, viscous dark brown colloidal solution. This colloidal solution became homogeneous in about 45 minutes of continued stirring. The sample was allowed to stir for 1.5 hours at room temperature and was then transferred to a polyethylene bottle and aged in a constant temperature bath at 50° C. for 6 days to give a dark brown thixotropic gelatinous colloidal dispersion, i.e., a colloidal dispersion in which the dispersed phase has combined to produce a semi-solid material with a three-dimensional solid network containing a large volume of interconnecting pores filled with a liquid.

The surface concentration of vanadium required to provide static decay of 5000 V to less than 50 V in less than 0.10 second, $[V]_{off}$, was determined for the vanadium oxide colloidal dispersion as follows: the vanadium oxide colloidal dispersion containing 1.1% vanadium, prepared as described above, was diluted with deionized H$_2$O to give a colloidal dispersion with 0.17, 0.084, 0.042, 0.021, 0.011, and 0.005% vanadium. These were coated using a No. 3 Mayer bar on PVDC primed polyester film to give vanadium oxide coatings with calculated surface vanadium concentrations of 11.5, 5.76, 2.88, 1.44, 0.72, and 0.36 mg/m$^2$, respectively. The static decay times for decay of a 5000 V potential to less than 50 V were measured for each of these coatings, and the value of $[V]_{off}$ was determined to be 1.4 mg/m$^2$.

The concentration of V$^{4+}$ in the thixotropic gelatinous colloidal dispersion containing 1.1% vanadium was determined by titration with permanganate as follows. The thixotropic gelatinous colloidal dispersion was diluted with deionized H$_2$O to give a dark brown colloidal dispersion containing 0.284 vanadium. A sample of this colloidal dispersion (90.0 g) was acidified with 18.6 g of 0.90M aqueous H$_2$SO$_4$ to give a light greenish yellow solution. This acidified colloidal dispersion was titrated with 21.5 mL of freshly standardized 0.019M KMnO$_4$ solution (MnO$_4^-$+5V$^{4+}$+8H$^+$+4-H$_2$O+Mn$^{2+}$). The endpoint was determined by the persistence of pink MnO$_4$ for greater than 10 seconds. A correction was made for reducible aldehydes in the supernatant liquid of the colloidal dispersion by precipitating out colloidal vanadium oxide and titrating the supernatant exactly as described above. To precipitate out the colloidal vanadium oxide, 3.33 g of Al$_2$(SO$_4$)$_3$.16H$_2$O was added to 200 g of the 0.28% vanadium-containing vanadium oxide colloidal dispersion, and the precipitated vanadium oxide was removed by centrifugation. For a 90.0 g sample of the supernatant liquid, 5.06 mL of 0.0198M KMnO$_4$ solution was required. The concentration of V$^{4+}$ in the vanadium oxide colloidal dispersion containing 0.284 vanadium was $1.8 \times 10^{-2}$ mole/kg. The mole fraction of V$^{4+}$ (V$^{4+}$/total vanadium) was 0.33.

A coating with a calculated surface vanadium concentration of 2.88 mg/m$^2$ (prepared by coating the 0.0424 vanadium oxide colloidal dispersion onto PVDC primed polyester film with a No. 3 Mayer bar) was evaluated by field emission scanning electron microscopy. The micrograph showed that the coating consisted of evenly dispersed, whisker-shaped colloidal particles of vanadium oxide, approximately 0.02–0.08 μm wide and 1.0–3.5 μm long. The aspect ratio was approximately 40 to 70 as measured by Field Emission Electron Microscopy (FESEM).

Calculation of coating weight:
Mol. Wt. Of V=50.94 g/mole
Mol. Wt. Of VO(O-$i$-Bu)$_3$=286.02 g/mole
Density of Vanadium Dispersion≈1 g/ML or 1 g/cm$^3$
Coating Thickness=$6.9 \times 10^{-6}$ meters In this example, 0.055 mole VO(O-$i$-Bu)$_3$ was used, which is equivalent to 0.055 mole V in 1.56 g H$_2$O$_2$+252.8 g H$_2$O=254.36 g total solvent mixture.

$$\frac{0.55 \text{ mole V}}{254.36 \text{ g solvent}} = \frac{0.22 \text{ mole V}}{\text{kg}} \text{ or } \frac{0.00022 \text{ mole V}}{\text{cm}^3 \text{ (or grams)}}$$

Coating area or volume = $6.9 \times 10^{-6}$ m × 1 m × 1 m
= $6.9 \times 10^{-6}$ m$^3$ or 6.9 cm$^3$ Assuming the density of the dispersion is 1 g/cm$^3$, then 6.9 grams is spread over 1 m$^3$ of substrate.

$$6.9 \text{ g} \times \frac{0.00022 \text{ mole V}}{\text{g solvent}} \times \frac{50.94 \text{ g V}}{\text{mole V}} =$$

0.077 grams V over a 1 m$^2$ area

But, the dispersions are diluted, so for example if 1.1% sol is diluted with the addition of 547 mL of H$_2$O to give a 0.17% sol, the calculated surface vanadium concentration is 11.5 mg/m$^2$.

EXAMPLES 2–7

The procedure of Example 1 was repeated, including the aging step, except the VO(O-$i$-Bu)$_3$ was replaced with equimolar amounts Of VO(OEt)$_3$ (Example 2), VO(O-$i$-Pr)$_3$ (Example 3), VO(O-$n$-Pr)$_3$ (Example 4), VO(O-$n$-Bu)$_3$ (Example 5), VO(O—CH$_2$CMe$_3$)$_{2.3}$(O-$i$-Bu)$_{0.7}$ (Example 6), and VO(O-$t$-Amyl)$_3$ (Example 7). VO(O-$i$-Pr)$_3$ was obtained from Alfa Products, Ward Hill, Mass., and used as received. VO(OEt)$_3$, VO(O-$n$-Pr)$_3$, VO(O-$n$-Bu)$_3$, and VO(O-$t$-Amyl)$_3$ were prepared by the reaction of ammonium metavanadate (product of Aldrich Chemical Co., Milwaukee, Wis.) with the corresponding alcohol as described by F. Cartan et al. in *J. Phys. Chem.*, 1960, 64, 1756, incorporated herein by reference. They were then purified by vacuum distillation. VO(O—CH$_2$CMe$_3$)$_{2.3}$(O-$i$-Bu)$_{0.7}$ was prepared by alcohol exchange from VO(O-$i$-Bu)$_3$ and purified by vacuum distillation. In each of Examples 2–7, the amount of deionized H$_2$O was adjusted to give a colloidal dispersion with 1.1% vanadium. For each reaction, the molar ratio of the vanadium alkoxide to H$_2$O$_2$ was 4:1, as in Example 1.

Values of $[V]_{off}$ for the vanadium oxide colloidal dispersions prepared in Examples 2-7 were determined as described in Example 1: Example 2, $[V]_{off}=1.4$ mg/m$^2$; Example 3, $[V]_{off}=1.4$ mg/m$^2$; Example 4, $[V]_{off}=1.4$ mg/m$^2$; Example 5, $[V]_{off}=2.9$ mg/m$^2$; Example 6, $[V]_{off}=2.9$ mg/m$^2$; Example 7, $[V]_{off}=2.9$ mg/m$^2$.

EXAMPLE 8

A vanadium oxide colloidal dispersion was prepared by adding VO(O-i-BU)$_3$ (product of Akzo Chemicals, Inc. Chicago, Ill.) to rapidly stirring deionized water to give a sol with a vanadium concentration of 0.22 mole/kg (1.1% vanadium). After stirring about 10 minutes, the sol became deep red and homogeneous. The sample was allowed to stir for 1.5 hour at room temperature. It was then transferred to a polyethylene bottle and aged in a constant temperature bath at 50° C. for 6 days to give a dark-brown thixotropic gelatinous colloidal dispersion.

The value of $[V]_{off}$ for the vanadium oxide colloidal dispersion was determined by diluting with deionized water, coating onto PVDC primed polyester film, and measuring static decay times as described in Example 1. It was found to be 1.4 mg/m$^2$. The concentration of V$^{4+}$ in the gelatinous colloidal dispersion was determined by titration with permanganate. Acidified colloidal dispersion containing (90.0 g, 0.284 vanadium) was titrated with 24.8 mL of freshly standardized 0.0198M KMnO$_4$ solution. Supernatant from the colloidal dispersion (90.0 g) was titrated with 5.05 mL of the 0.0198M KMnO$_4$ solution as described in Example 1. The concentration of V$^{4+}$ in the 0.284 vanadium-containing vanadium oxide colloidal dispersion was $2.2 \times 10^{-2}$ mole/kg. The mole fraction V$^{4+}$ (V$^{4+}$/total vanadium) was 0.39.

EXAMPLES 9-12

The procedure of Example 8 was repeated except the VO(O-i-Bu)$_3$ was replaced with equimolar amounts of VO(O-i-Pr)$_3$(Example 9), VO(O-n-Pr)$_3$ (Example 10), VO(O-n-Bu)$_3$ (Example 11), and VO(OCH$_2$CMe$_3$)$_{2.3}$(O-i-Bu)$_{0.7}$ (Example 12). Values of $[V]_{off}$ for the vanadium oxide colloidal dispersions prepared in Examples 9-12 were determined as described in Example 1: Example 9, $[V]_{off}=1.4$ mg/m$^2$; Example 10, $[V]_{off}=2.9$ mg/m$^2$; Example 11, $[V]_{off}=5.8$ mg/m$^2$; Example 12, $[V]_{off}=2.9$ mg/m$^2$.

EXAMPLE 13

This Example describes the preparation of a vanadium oxide colloidal dispersion from VOCl$_3$, via in situ generated vanadium alkoxide species. VOCl$_3$ (25.1 g, 0.145 mol, product of Aldrich, Milwaukee, Wis.) was added dropwise to a solution of propylene oxide (42.03 g, 0.724 mol, product Aldrich, Milwaukee, Wis.) and i-BuOH (71.6 g, 0.966 mol, product of Aldrich, Milwaukee, Wis.) contained in a stoppered, nitrogen purged 500 mL round-bottomed flask. The reaction mixture was rapidly stirred and cooled in an 30 ice water bath. The rate of addition of VOCl$_3$ was controlled so that the reaction temperature did not exceed 25° C. Volatile compounds were removed from the reaction mixture by rotary evaporation at 60°-70° C. to give 48.9 g of a light yellow liquid. GC/MS analysis of the volatile reaction products indicated the presence of approximately 65% i-BuOH, 30% 1-chloro-2-propanol, 4% 2-chloro-1-propanol, and minor amounts of 1-(2-methyl propoxy)-2-propanol and 2-(-2-methyl propoxy)-1-propanol, The distillation residue, i.e., the light yellow liquid, (10.0 g, containing 0.030 mol vanadium) was added to 125.4 g rapidly stirring deionized H$_2$O to give a product which was deep red and homogeneous after stirring approximately 15 minutes. After stirring overnight at room temperature, the sample was aged at 50° C. for 2 days to give a vanadium oxide colloidal dispersion containing 1.1% vanadium. The value for $[V]_{off}$ for the colloidal dispersion was 11.5 mg/m$^2$ as determined by the procedure described in Example 1.

EXAMPLE 14

The procedure of Example 13 was repeated except the distillation residue (10.0 g) was added to a solution of H$_2$O$_2$ (0.85 g of 30% solution, 0.0076 mol) in 124.5 g deionized H20. Upon addition of the distillation residue, the mixture became dark brown and gelled within five minutes. With continued stirring, the dark brown gel broke up giving an inhomogeneous, viscous dark brown sol which was homogeneous in about 45 minutes. The sample was allowed to stir overnight at room temperature and was then aged at 50° C. for 2 days. The value of $[V]_{off}$ for the colloidal dispersion was 5.8 mg/m$^2$ as determined by the procedure described in Example 1.

EXAMPLE 15

This Example demonstrates the preparation of a vanadium oxide colloidal dispersion from VO$_2$OAC, preslimably via in situ generated vanadium alkoxide species. VO$_2$OAc (1.00 g, 7.0 mmol, prepared as described by F. Preuss et al. in Inorg. Nucl. Chem., 35, 3723 (1973)) was dissolved in 1.57 g i-BuOH to give a clear, dark greenish black solution. This solution was added to 29.45 g rapidly stirring deionized water and after stirring for 5 hours gave a clear, greenish brown colloidal dispersion of vanadium oxide. The vanadium oxide colloidal dispersion was aged for 6 days at room temperature. The value of $[V]_{off}$ for the colloidal dispersion was 11.5 mg/m$^2$ as determined by the procedure described in Example 1.

EXAMPLES 16-20

These Examples show the effect of varying vanadium concentrations in the alkoxide hydrolysis reaction on the effectiveness of vanadium oxide colloidal dispersions for the preparation of antistatic coatings. Vanadium oxide colloidal dispersions were prepared by adding VO(O-i-Bu)$_3$ to rapidly stirring deionized water in the amounts shown in Table 1. After aging overnight at room temperature, the colloidal dispersions were allowed to age three more days at room temperature or 50° C. $[V]_{off}$ of the colloidal dispersions, determined as described in Example 1, are listed in Table 1.

TABLE 1

| Example | Mass VO(O-i-Bu)$_3$ | Mass Water | Percent Vanadium | $[V]_{eff}^a$ (mg/m$^2$) | $[V]_{eff}^b$ (mg/m$^2$) |
|---|---|---|---|---|---|
| 16 | 1.58 g | 98.4 g | 0.28% | 11.5 | 11.5 |
| 17 | 3.16 g | 96.8 g | 0.56% | 11.5 | 11.5 |
| 18 | 6.30 g | 93.7 g | 1.12% | 11.5 | 5.8 |
| 19 | 12.6 g | 87.4 g | 2.25% | 11.5 | 11.5 |
| 20 | 25.2 g | 74.8 g | 4.50% | 23.0 | 92.0 |

$^a$Aged 3 days at 21° C.
$^b$Aged 3 days at 50° C.

These results compare $[V]_{off}$ for coatings prepared from aged dispersions containing vanadium within the acceptable range, i.e., no greater than about 3.5 wt-%, to the $[V]_{off}$ for a coating prepared from an aged dispersion having an unacceptably high vanadium content, i.e., 4.5 wt-%. The dispersion having a 4.5% vanadium concentration is not acceptable because it is very viscous, and does not provide a good coating. In fact, upon aging at 50° C. for 3 days, the dispersion became extremely viscous and produced a coating with a very large $[V]_{off}$. Dispersions with 0.28%, 0.56%, or 2.25% vanadium concentrations are acceptable in that they provide good antistatic coatings. A dispersion containing 1.12% vanadium is the most acceptable and most preferred because it is capable of forming a coating with the lowest $[V]_{off}$ of all those tested in Examples 16–20.

EXAMPLE 21

This Example demonstrates the preparation of a vanadium oxide colloidal dispersion with a surfactant and/or water-miscible cosolvent as an additive. This Example also demonstrates the coating of various substrates.

A coating sol was prepared by adding 25.2 g deionized water and 0.3 g of 10 wt-% TRITON ™ X-100 surfactant to 4.5 g of a vanadium oxide colloidal dispersion containing 0.56 wt-% vanadium, prepared as described in Example 1. The coating sol was applied to KAPTON ™ polyimide film (product of DuPont Company, Wilmington, Del.) using a No. 3 Mayer bar. The coating was dried at 130° C. for 5 minutes. The static decay time of the coated film was 0.01 second. The uncoated film did not exhibit static decay.

The coating sol was applied to paper (Type 696 White Bond Paper, available from 3M Office Systems Division, St. Paul, Minn.) using a No. 3 Mayer bar. The coating was dried at 100° C. for 5 minutes to give a sample with a static decay time of 0.01 second. The static decay time for the uncoated paper was 20 seconds.

This same coating Sol was applied to polypropylene film, which had been pretreated by flame treating, using a No. 3 Mayer bar. The coating was dried at 100° C. for 5 minutes. The static decay time of the coated film was 0.01 second. The uncoated film did not exhibit static decay.

EXAMPLE 22

This Example demonstrates the preparation of a vanadium oxide colloidal dispersion by hydrolysis of VO(O-$i$-BU)$_3$ in an aqueous polymer dispersion. Potassium persulfate (5.0 g of a 5% solution, 0.9 mmol, product of Mallinckrodt Chemical, St. Louis, Minn.), sodium metabisulfate (5.0 g of a 5% solution, 1.3 mmol, product of Matheson, Coleman, and Bell, Norwood, Ohio), and ferrous sulfate (1.0 g of a 1% solution, 0.04 mmol, product of Fischer Scientific, Fairlawn, N.J.) were added sequentially to a nitrogen purged mixture of 300 g of deionized water, 70.0 g methylmethacrylate (0.70 mol, product of Aldrich Chemical, Milwaukee, Wis.) and sodium lauryl sulfate (10.0 g of 10%, product of Aldrich Chemical, Milwaukee, Wis.) to give a colloidal dispersion of polymethyl methacrylate. The sodium lauryl sulfate is a stabilizer, while the potassium persulfate, sodium metabisulfate, and ferrous sulfate are redox initiators for the polymer emulsion. The dispersion was placed in dialysis tubing (12,000–14,000 molecular weight cutoff, product of American Scientific Products, McGaw Park, Ill.) and dialyzed against deionized water for four days to yield a dialyzed polymethylmethacrylate colloidal dispersion containing 11.9% solids by weight. VO(O-$i$-Bu)$_3$ (1.87 g, 6.5 mmol) was added to a mixture of 96.24 g of 11.9% dialyzed polymethylmethacrylate colloidal dispersion plus 1.87 g of 3.0% H$_2$O$_2$ to give a brownish, opaque dispersion. After ageing at 50° C. for three days, the dispersion was diluted and coated onto PVDC primed polyester film. $[V]_{off}$ for the dispersion was 5.8 mg vanadium per m$^2$ of film.

EXAMPLE 23

This Example shows that reduction of V$^{5+}$ to V$^{4+}$ can be limited and V$^{4+}$ concentrations controlled by removing volatile reaction products through distillation subsequent to the hydrolysis reaction. A vanadium oxide colloidal dispersion was prepared as described in Example 1 except that 30 minutes after the addition of VO(O-$i$-Bu)$_3$ to the hydrogen peroxide solution, volatile reaction products (79.8 g) were removed by rotary evaporation at 50° C. The resulting colloidal dispersion was diluted with water to about 335 g and rotary evaporation repeated removing 156 g of volatile materials to give a colloidal dispersion containing about 1.5% vanadium. This was diluted and titrated with standard KMnO$_4$ as described in Example 1. A vanadium oxide colloidal dispersion containing 0.28% vanadium (90.0 g) was titrated with 2.79 mL of 0.0198 KMnO$_4$ solution and the supernatant liquid (90.0 g) was titrated with 1.27 mL of 0.0198 KMnO$_4$ solution. The concentration of V$^{4+}$ in the colloidal dispersion containing 0.284 vanadium was $1.6 \times 10^{-3}$ mole/kg. The mole fraction V$^{4+}$ (V$^{4+}$/total vanadium) was 0.030:1.0.

EXAMPLE 24

This Example demonstrates the preparation of a vanadium oxide colloidal dispersion in an acetone/water mixture. VO(O-$i$-Bu)$_3$ (6.30 g, 0.022 mol) was added to a rapidly stirring solution of 43.7 g (2.6 mol) deionized water in 50.0 g of acetone. The sample was stirred one day at room temperature and then aged at 50° C. for 3 days. $[V]_{off}$ for the colloidal dispersion, determined as described in Example 1, was 5.8 mg/m$^2$.

EXAMPLE 25

This experiment was carried out to investigate the effect of changing salt concentration on the precipitation or flocculation of the sol. Salts were added at a concentration (measured in parts per million, ppm) to produce flocculation of the vanadium oxide sol in less than one minute. The amounts were calculated as parts per million based on the total amount of solution. The vanadium oxide sol was prepared as described in Example 1, and diluted to the concentrations shown in the table.

TABLE 2

| Salt/Sol Conc. | 0.075% | 0.15% | 0.30% | 0.60% |
| --- | --- | --- | --- | --- |
| NaOAc | 700 | 700 | 800 | 800 |
| Na$_4$.EDTA | 1200 | 1250 | 1100 | 900 |
| NaNO$_3$ | 400 | 500 | 400 | 400 |
| AgNO$_3$ | 130 | 160 | 190 | 180 |
| Mg(NO$_3$)$_2$ | 40 | 50 | 70 | 70 |
| Ca(NO$_3$)$_2$ | 30 | 60 | 60 | 60 |
| Fe(NO$_3$)$_2$ | 70 | 90 | 90 | 80 |

This indicates that the sols are much less stable in the presence of the divalent ions such as Mg$^{2+}$, Ca$^{2+}$, or Fe$^{2+}$, and much more tolerant to the presence of Na$^+$ ions. Hence, the sols could be prepared in "softened" water. The deionized water used in the methods of the present invention typically had a total cation content of less than 50 parts per million.

EXAMPLE 26

In this example, amorphous vanadium oxide antistat will be utilized as a combination controlled release layer/antistat for a strippable top film of a flexographic printing plate. This top film is removed prior to imaging the flexographic printing plate.

A pigmented radiation hardenable layer was prepared as follows:

A. A pigmented mill base was prepared by combining 3000 grams of methyl ethyl ketone, 1500 grams of microlith Violet BK pigment and 2500 grams of a 30% solids solution in methyl ethyl ketone of a radiation crosslinkable methacrylate functional poly vinyl chloride resin (as described in U.S. Pat. No. 4,889,895) and sand milling until smooth.

B. A coating solution of a radiation hardenable composition containing a visible light absorbing pigment was prepared from the above mill base by combining the following ingredients:

700 grams of above mill base (32.1% solids)
7383 grams of a 30% solution of a methacrylate functional poly vinyl chloride resin (as described in U.S. Pat. No. 4,889,895)
5375 grams of a 29.3% solution of a radiation curable polyurethane resin (described in Example 1A) in methyl ethyl ketone solvent.
112.5 grams of Irgacure-651 photoinitiator
2.3 grams of FC-430 surfactant (a product of 3M Company)
16,198 grams of methyl ethyl ketone An aqueous coating solution consisting of a 0.3% by weight suspension of vanadium oxide in water with a trace of Triton X-100 surfactant was coated on a 3.8 mil polyester film using a B & M bar. The dried coating weight was approximately 35 mg/meter$^2$ and was controlled by operating at the minimum flow rate (from the Zenith pump) which would produce a void free wet coating observed as the moving web exited the coating zone and before drying began. Following oven drying (at 200° F.), the pigmented solvent based top coat solution was applied using the same coating method to produce a dry coating weight of 495 milligrams per square foot. For reference purposes, a section of bare polyester (without antistat coating) was also overcoated with the above top coat solution at the same dry coating weight of radiation hardenable pigmented layer.

Sections of each of the above coated 3.8 mil polyester films (with and without antistat layer) were laminated to extruded flexographic printing plate material using a heated two roll laminator operating at 110° C. at a web speed of 5 feet/minute with the radiation hardenable layer in contact with the curable elastomer layer of the flexographic printing plate material. Following hot lamination, 1 inch by 6 inch strips of material were cut from each sheet and tested for release characteristics using an Instron tester. The force required to delaminate the top film from the support film/elastomer/top coat sandwich with and without the antistat layer was measured. Conditions for testing were as follows:
Jaw Speed = 1 inch/minute
Peel Angle = 180 degrees
Sample Width = 1 inch
Data are as follows (average of 5 samples):

| Sample | Maximum Peel Force (grams) | Average Peel Force (grams) |
|---|---|---|
| Control-no antistat | 79.4 | 33.6 |
| With 35 mg/ft$^2$ antistat (V205) | 9.8 | 7.8 |

It was clearly observed that without the antistat layer, the release of the top film from the radiation hardenable layer was jerky (release and grab in alternate order) whereas the release of top film layer from the plate surface in the presence of the antistat layer was uniform and no jerky.

The static decay characteristics of each of these constructions was also measured and were as follows:

| | Time to Dissipate 5 KeV Applied Charge (sec) |
|---|---|
| Without V205 antistat layer | ∞ |
| Invention Construction | <0.1 |
| Invention Construction (Cover Sheet Removed) | <0.1 |
| Flexographic Printing Plate (Invention construction without cover sheet) | <0.1 |
| Cover Sheet only (after removal) | ∞ |

As can be observed from the data, the antistatic V$_2$O$_5$ layer has transferred to the flexographic printing plate surface thereby providing antistatic protection to the plate.

COMPARATIVE EXAMPLE 1

This Example demonstrates the preparation of V$_2$O$_5$ dispersions according to U.S. Pat. No. 4,203,769. V$_2$O$_5$ (15.6 g, 0.086 mol, product of Aldrich, Milwaukee, Wis.) was heated in a covered platinum crucible for 10 minutes at 1100° C. and then poured into 487 g of rapidly stirring deionized H$_2$O. The resulting liquid plus gelatinous black precipitate was warmed to 40°–45° C. for 10 minutes and allowed to stir for 1 hour at room temperature to give a soft, thixotropic black gel which was diluted with 277 g deionized H$_2$O to give a vanadium oxide colloidal dispersion containing 1.1% vanadium. The viscous colloidal dispersion was filtered to remove undispersed V$_2$O$_5$ and then aged at 50° C. for 6 days. The value of $[V]_{off}$ of the colloidal dispersion prepared in this manner was 1.4 mg/m$^2$.

The concentration of V$^{4+}$ in the colloidal dispersion was determined by titration with permanganate as described in Example 1. The vanadium oxide colloidal dispersion (90.0 g, containing 0.28% vanadium) was acidified and titrated with 5.05 mL of 0.0198M KMnO$_4$ solution. The supernatant liquid (90.0 g) was titrated, after acidification with 0.90 mL of 0.0198M KMnO$_4$ solution. The concentration of V$^{4+}$ in the colloidal dispersion containing 0.28% vanadium was 4.5×10$^{-3}$ mole/kg. The mole fraction of V$^{4+}$ (V$^{4+}$/total vanadium) was 0.083.

A coating with a calculated surface vanadium concentration of 2.88 mg/m$^2$ (prepared by coating the vanadium oxide colloidal dispersion containing 0.042% vanadium onto PVDC primed polyester film with a No. 3 Mayer bar) was evaluated by field emission scanning electron microscopy. This showed that the coating consisted of evenly dispersed, whisker-shaped colloidal particles of vanadium oxide, approximately 0.01–0.05

μm wide and 1.0–2.0 μm long. The aspect ratio was approximately 25 to 120 as measured by FESEM.

This Example shows that solutions prepared according to U.S. Pat. No. 4,203,769 have similar properties to those prepared by the alkoxide process of the present invention; however, the former process is disadvantageous because of the need for special containers, the generation of highly toxic $V_2O_5$ fumes by heating to high temperatures, and the difficulty in filtering out nondispersed $V_2O_5$. Furthermore, the concentration of $V^{4+}$ is not easily controlled as it is for the present invention. Also, the $V^{4+}/V^{4+}+V^{5+}$ ratio is limited to less than about 0.10, whereas by the process of the present invention, variable ratios up to and over 0.30 are possible.

COMPARATIVE EXAMPLE 2

This Example demonstrates the preparation of a vanadium oxide colloidal dispersion by an ion exchange process. Sodium metavanadate (6.0 g, 0.049 mol, product of Alfa Products, Ward Hill, Mass.) was dissolved by warming in 144 g deionized $H_2O$. The resulting solution was filtered to remove insoluble material. The filtered solution was pumped through a 15 mm×600 mm chromatography column containing 600 mL of AMBERLITE TM IR 120 Plus (H+) (available from Aldrich Chemical, Milwaukee, Wis.) to give a light orange solution containing 1.7% vanadium. The solution became a soft opaque brick red gel upon standing at room temperature for 24 hr. After aging for 9 days at room temperature, the sample was diluted to give a hazy orange-red colloidal dispersion containing 0.17% vanadium. The value of $[V]_{off}$ for the colloidal dispersion, determined as described in Example 1, was 23.0 mg/m$^2$.

The concentration of $V^{4+}$ in the colloidal dispersion was determined by titration with permanganate as described in Example 1. The vanadium oxide colloidal dispersion (125.0 g, containing 0.17% vanadium) was acidified and titrated with 0.30 mL of 0.0206M $KMnO_4$ solution. The supernatant liquid (125.0 g) was titrated, after acidification, with 0.05 mL of 0.0206M $KMnO_4$ solution. The concentration of $V^{4+}$ in the colloidal dispersion containing 0.174 vanadium was $2.06 \times 10^4$ mole/kg. The mole fraction of $V^{4+}$ ($V^{4+}$/total vanadium) was 0.006.

A coating with a calculated surface vanadium concentration of 2.88 mg/m$^2$ (prepared by coating a diluted vanadium oxide colloidal dispersion containing 0.0424 vanadium onto PVDC primed polyester film with a No. 3 Mayer bar) was evaluated by field emission scanning electron microscopy. This showed that the coating consisted of clumped whisker-shaped colloidal particles of $V_2O_5$, approximately 0.02–0.08 μm wide and 0.7–1.7 μm long. The aspect ratio was approximately 4 to 25 as measured by FESEM.

This Example shows that solutions prepared by an ion exchange process are much less effective for the preparation of antistatic coatings than the colloidal dispersions of the present invention.

COMPARATIVE EXAMPLE 3

This Example demonstrates the preparation of a vanadium oxide colloidal dispersion by thermohydrolysis of $VOCl_3$. Vanadium oxytrichloride (5.72 g, 0.017 mol, product of Aldrich Chemical Co. Milwaukee, Wis., used as received) was added via a syringe to 144.3 g deionized $H_2O$ to give a light orange colored solution. This was heated to 85°–95° C. for approximately 30 minutes to give a hazy orange-red colloidal dispersion containing 1.1% vanadium. The colloidal dispersion was centrifuged at 5050×g to give a brick red gelatinous solid and a clear water white supernatant liquid. The solid was redispersed in deionized water to give 150 g of colloidal dispersion. The steps of centrifuging and redispersing were repeated more times to give a vanadium oxide colloidal dispersion containing 1.1% vanadium. The value of $[V]_{off}$ for the colloidal dispersion was found to be 46 mg/m$^2$ by the procedure described in Example 1.

A coating with a calculated surface vanadium concentration of 2.88 mg/m$^2$ (prepared by coating a diluted vanadium oxide colloidal dispersion containing 0.0424 vanadium onto PVDC primed polyester film with a No. 3 Mayer bar) was evaluated by field emission scanning electron microscopy. This showed that the coating consisted of isolated aggregates about 2–3 μm in diameter. Each aggregate consisted of whisker-shaped colloidal particles of vanadium oxide approximately 0.02–0.08 μm wide and about 0.3–1.3 μm long. The aspect ratio was approximately 1.5 to 3.0 as measured by FESEM.

This Example shows that sols prepared by the thermohydrolysis of $VOCl_3$ are much less effective for the preparation of antistatic coatings than the colloidal dispersions of the present invention.

COMPARATIVE EXAMPLE 4

This Example demonstrates the preparation of a vanadium oxide colloidal dispersion by the reaction of $V_2O_5$ with $H_2O_7$. Hydrogen peroxide (30%, 20.0 g, 0.176 mol) was added to a crystalline $V_2O_5$ (2.00 g, 0.011 mol, product of Aldrich Chemical Co., Milwaukee, Wis., used as received) suspended in 78.1 g of rapidly stirring deionized water. A vigorous reaction was observed with the evolution of a gas and warming of the reaction mixture. After stirring overnight at room temperature the product was a hazy, orange-brown colloidal dispersion. This colloidal dispersion was heated to 90° C. for 75 minutes. $[V]_{off}$ was found to be 11.5 mg/m$^2$ by the method described in Example 1.

A coating with a calculated surface vanadium concentration of 2.88 mg/m$^2$ (prepared by coating a diluted vanadium oxide colloidal dispersion containing 0.0424 vanadium onto PVDC primed polyester film with a No. 3 Mayer bar) was evaluated by field emission scanning electron microscopy. This showed that the coating consisted of well dispersed whisker shaped colloidal particles of vanadium oxide, approximately 0.01–0.08 μm wide, and about 0.3–1.2 μm long. The aspect ratio was approximately 7 to 18 as measured by FESEM.

This Example shows that solutions prepared by the reaction of $V_2O_5$ with $H_2O_2$ are much less effective for the preparation of antistatic coatings than the colloidal dispersions of the present invention prepared from vanadium oxide trialkoxides.

COMPARATIVE EXAMPLE 5

This Example demonstrates the preparation of a vanadium oxide colloidal dispersion according to the procedure reported by C. Sanchez et al. in *Met. Res. Soc. Symp. Proc.*, 121, 93 (1988). $VO(O\text{-}t\text{-Amyl})_3$ (1.00 g, 3.04 mmol) was added to rapidly stirring deionized water (6.00 g) to give a light yellow aqueous solution plus a yellow oil. The yellow oil disappeared as the aqueous phase became deep red in color. The mixture became homogeneous in about 6 minutes. After stirring for 15 minutes, the reaction product was homogeneous and deep red with a vanadium content of 2.2%. The value of $[V]_{off}$ for this colloidal dispersion was found to be 23.0 mg/m$^2$ by the method described in Example 1. The sample was allowed to age at 21° C. overnight to give a gelatinous, thixotropic deep red-brown colloidal dispersion. The value of $[V]_{off}$ for this aged colloidal dispersion was found to be 11.5 mg/m$^2$. This Example shows that colloidal dispersions prepared by the method of Sanchez et al. are much less effective for the preparation of antistatic coatings than the colloidal dispersions of the present invention prepared from vanadium oxide trialkoxides.

The invention has been described with reference to various specific and preferred embodiments and techniques. It should be understood, however, that many variations and modifications can be made while remaining within the spirit and scope of the invention.

The particles of vanadium oxide exist as a porous layer of particles (generally as fibers, fibrils or particles with one dimension significantly greater than the other dimensions) in intimate contact with each other. By intimate contact it is meant that particles physically contact other particles. The contact may be only at cross-over or intersection points or may be more extensive. Across the length of the layer, a conductive path is created by the particle-to-particle contact. The particles may or may not be actually bound to particles at the point of contact. There may be only physical contact, electronic attraction, or some chemical bonding, as long as the conductive mechanism of the particles is maintained.

The particles should be removable in uncured areas of the plate by wash-of f development or by being carried along with wicked uncured photohardenable elastomer. This would be done by having weak or no bonds between the discrete particles.

What is claimed is:

1. A flexographic printing plate comprising in the following order a flexible substrate, a photohardenable composition, and a vanadium oxide antistatic layer.

2. The plate of claim 1 wherein a radiation curable top coat layer is present below said antistatic layer and adjacent to said photohardenable composition.

3. The plate of claim 1 wherein said photohardenable composition comprises ethylenically unsaturated polymerizable materials.

4. The plate of claim 2 wherein said photohardenable composition comprises ethylenically unsaturated polymerizable materials.

5. The plate of claim 2 wherein said radiation curable top coat layer contains visible pigment.

6. The plate of claim 4 wherein said radiation curable top coat layer contains visible pigment.

7. The plate of claim 1 wherein a primer layer is between said flexible substrate and said photohardenable composition.

8. The plate of claim 2 wherein a primer layer is between said flexible substrate and said photohardenable composition.

9. The plate of claim 7 wherein said primer layer comprises an aziridine.

10. The plate of claim 8 wherein said primer layer comprises an aziridine.

11. The plate of claim 3 wherein said ethylenically unsaturated material comprises an acrylic functional polymerizable material.

12. The plate of claim 4 wherein said ethylenically unsaturated material comprises an acrylic functional polymerizable material.

13. The plate of claim 5 wherein said photohardenable composition comprises acrylic functional polymerizable material.

14. The plate of claim 7 wherein said photohardenable layer comprises acrylic functional polymerizable material.

15. The plate of claim 10 wherein said photohardenable layer comprises acrylic functional polymerizable material.

16. The plate of claim 1 wherein said photohardenable layer comprises an ethylenically unsaturated elastomeric polymerizable material.

17. The plate of claim 2 wherein said photohardenable layer comprises an ethylenically unsaturated elastomeric polymerizable material.

18. The plate of claim 5 wherein said photohardenable layer comprises an ethylenically unsaturated elastomeric polymerizable material.

19. The plate of claim 10 wherein said photohardenable layer comprises an ethylenically unsaturated elastomeric polymerizable material.

20. The plate of claim 16 wherein said ethylenically unsaturated material comprises a material with acrloyl or methacryloyl polymerizable groups thereon.

21. The plate of claim 17 wherein said ethylenically unsaturated elastomeric material comprises a material having acryloyl or methacryloyl polymerizable groups thereon.

22. The plate of claim 19 wherein said ethylenically unsaturated elastomeric material comprises a material having acryloyl or methacryloyl polymerizable groups thereon.

* * * * *

UNITED STATES PATENT AND TRADEMARK OFFICE
CERTIFICATE OF CORRECTION

PATENT NO. : 5,322,761
DATED : June 21, 1994
INVENTOR(S) : Kausch et al.

It is certified that error appears in the above-indentified patent and that said Letters Patent is hereby corrected as shown below:

Column 6, line 4, delete "07/893,502" and insert --07/893,504--.

Column 6, line 66, delete "$5.0 \times 10^4 \mu m$" and insert --$5.0 \times 10^{-4} \mu m$--.

Column 7, line 67, delete "a," and insert --a--.

Column 10, line 11, delete "process;." and insert --process.--.

UNITED STATES PATENT AND TRADEMARK OFFICE
CERTIFICATE OF CORRECTION

PATENT NO. : 5,322,761
DATED : June 21, 1994
INVENTOR(S) : Kausch et al.

It is certified that error appears in the above-indentified patent and that said Letters Patent is hereby corrected as shown below:

Column 11, line 31, delete "each'substituent"
and insert --each substituent--.
Column 11, lines 45-46, delete "VO(O-CH$_2$CMe$_3$)$_{23}$(O-$i$-Bu)$_{0.7}$."
and insert --VO(O-CH$_2$CMe$_3$)$_{2.3}$(O-$i$-Bu)$_{0.7}$.--
Column 12, line 51, delete "([V]$_{off}$,"
and insert --([V]$_{eff}$,--.
Column 12, lines 53, 55 and 66, delete "[V]$_{off}$"
and insert --[V]$_{eff}$--.

UNITED STATES PATENT AND TRADEMARK OFFICE
CERTIFICATE OF CORRECTION

PATENT NO. : 5,322,761
DATED : June 21, 1994
INVENTOR(S) : Kausch et al.

It is certified that error appears in the above-indentified patent and that said Letters Patent is hereby corrected as shown below:

Column 13, line 16, delete "$[V]_{off}$" and insert --$[V]_{eff}$--.

Column 13, line 53, delete "Present" and insert --present--.

Column 14, line 14, delete "OH" and insert --$OH^-$--.

Column 15, line 13, delete "$H_2O$" and insert --$H_2O_2$--.

Column 15, line 17, delete "$[V]_{off}$" and insert --$[V]_{eff}$--.

Column 23, line 44, delete "154" and insert --15%--.

UNITED STATES PATENT AND TRADEMARK OFFICE
CERTIFICATE OF CORRECTION

PATENT NO. : 5,322,761
DATED : June 21, 1994
INVENTOR(S) : Kausch et al.

It is certified that error appears in the above-indentified patent and that said Letters Patent is hereby corrected as shown below:

Column 23, line 45, delete "104"
and insert --10%--.
Column 23, line 64, delete "1.04"
and insert --1.0%--.
Column 26, line 59, delete "termperature"
and insert --temperature--.
Column 28, line 36, delete "1e"
and insert --$R^4$--.
Column 30, line 32, delete "0.075 g"
and insert --0.075μ--.

UNITED STATES PATENT AND TRADEMARK OFFICE
CERTIFICATE OF CORRECTION

PATENT NO. : 5,322,761
DATED : June 21, 1994
INVENTOR(S) : Kausch et al.

Page 5 of 10

It is certified that error appears in the above-indentified patent and that said Letters Patent is hereby corrected as shown below:

Column 30, line 33, delete "1 g"

and insert --1µ--.

Column 36, line 31, delete "coatings" (second occurrence)

and insert --Coatings--.

Column 36, line 34, delete "Specially"

and insert --Specialty--.

Column 36, line 41, delete "$([V]_{off},$"

and insert --$([V]_{eff},$--.

Column 37, line 6, delete "OH"

and insert --$OH^-$--.

Column 37, line 35, delete "$[V]_{off},$"

and insert --$[V]_{eff},$--.

Column 37, line 47, delete "$[V]_{off}$"

and insert --$[V]_{eff}$--.

UNITED STATES PATENT AND TRADEMARK OFFICE
CERTIFICATE OF CORRECTION

PATENT NO. : 5,322,761
DATED : June 21, 1994
INVENTOR(S) : Kausch et al.

It is certified that error appears in the above-indentified patent and that said Letters Patent is hereby corrected as shown below:

Column 37, line 53, delete "0.284" and insert --0.28%--.

Column 37, line 58, change the first five characters of the formula from "(MnO$_4$" to --(MnO$_4^-$--.

Column 38, line 4, delete "0.284" and insert --0.28%--.

Column 38, line 9, delete "0.0424" and insert --0.042%--.

Column 38, line 21, delete "g/ML" and insert --g/mL--.

UNITED STATES PATENT AND TRADEMARK OFFICE
CERTIFICATE OF CORRECTION

PATENT NO. : 5,322,761
DATED : June 21, 1994
INVENTOR(S) : Kausch et al.

It is certified that error appears in the above-indentified patent and that said Letters Patent is hereby corrected as shown below:

Column 39, lines 1, 3, 4, 5 (2 occurrences), 6 (2 occurrences), 21, 43, 46 (2 occurrences), 47, 48;
Column 40, lines 9, 24, 39, 53, 66;
Column 41, lines 1, 7, 12;
Column 42, lines 6, 40;
Column 44, line 48;
Column 45, line 33;
Column 46, lines 10, 42; and
Column 47, lines 4 and 8,
delete "$[V]_{off}$" and insert --$[V]_{eff}$--.

UNITED STATES PATENT AND TRADEMARK OFFICE
CERTIFICATE OF CORRECTION

PATENT NO. : 5,322,761
DATED : June 21, 1994
INVENTOR(S) : Kausch et al.

It is certified that error appears in the above-indentified patent and that said Letters Patent is hereby corrected as shown below:

Column 39, line 28, delete "0.284" and insert --0.28%--.

Column 39, line 33, delete "0.284" and insert --0.28%--.

Column 39, line 60, delete "an 30 ice" and insert --an ice--.

Column 40, line 29, delete "VO₂OAC" and insert --VO$_2$OA$_c$--.

Column 41, line 38, delete "Sol" and insert --sol--.

Column 41, line 50, delete "St. Louis, Minn.)," and insert --St. Louis, Missouri),--.

UNITED STATES PATENT AND TRADEMARK OFFICE
CERTIFICATE OF CORRECTION

PATENT NO. : 5,322,761
DATED : June 21, 1994
INVENTOR(S) : Kausch et al.

It is certified that error appears in the above-indentified patent and that said Letters Patent is hereby corrected as shown below:

Column 42, line 28, delete "0.284"
and insert --0.28%--.
Column 45, line 44, delete "0.174"
and insert --0.17%--.
Column 45, line 44, delete "2.06 x 10$^4$"
and insert --2.06 x 10$^{-4}$--.
Column 45, line 49, delete "0.0424"
and insert --0.042% --.
Column 46, line 8, delete "repeated more"
and insert --repeated 5 more--.
Column 46, line 15, delete "0.0424"
and insert --0.042%--.

UNITED STATES PATENT AND TRADEMARK OFFICE
CERTIFICATE OF CORRECTION

PATENT NO. : 5,322,761
DATED : June 21, 1994
INVENTOR(S) : Kausch et al.

It is certified that error appears in the above-indentified patent and that said Letters Patent is hereby corrected as shown below:

Column 46, line 33, delete "$H_2O_7$" and insert --$H_2O_2$--.

Column 46, line 46, delete "0.0424" and insert --0.042%--.

Column 47, line 37, delete "wash-of f" and insert --wash-off--.

Signed and Sealed this

Eleventh Day of April, 1995

Attest:

BRUCE LEHMAN

Attesting Officer

Commissioner of Patents and Trademarks